(12) United States Patent  
Hasunuma

(10) Patent No.: US 8,847,353 B2
(45) Date of Patent: Sep. 30, 2014

(54) SEMICONDUCTOR DEVICE AND DATA PROCESSING SYSTEM USING THE SAME

(75) Inventor: Eiji Hasunuma, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 13/329,650

(22) Filed: Dec. 19, 2011

(65) Prior Publication Data

US 2012/0153436 A1 Jun. 21, 2012

(30) Foreign Application Priority Data

Dec. 20, 2010 (JP) ................. 2010-283353

(51) Int. Cl.
*H01L 21/02* (2006.01)
*H01L 27/108* (2006.01)
*H01L 29/94* (2006.01)
*H01L 49/02* (2006.01)
*H01L 27/02* (2006.01)
*H01L 21/336* (2006.01)
*H01L 21/20* (2006.01)

(52) U.S. Cl.
CPC .... *H01L 27/10817* (2013.01); *H01L 27/10897* (2013.01); *H01L 27/10852* (2013.01); *H01L 27/10894* (2013.01); *H01L 28/91* (2013.01); *H01L 27/0207* (2013.01)
USPC .......... 257/532; 257/307; 257/308; 257/309; 438/301; 438/303; 438/381; 438/386; 438/393; 438/396

(58) Field of Classification Search
USPC .......... 257/532, 306, E29.342; 438/381, 386, 438/396, 393, 303, 301
See application file for complete search history.

(56) References Cited

U.S. PATENT DOCUMENTS

| | | | |
|---|---|---|---|
| 2006/0097299 A1* | 5/2006 | Ahn et al. ................. | 257/295 |
| 2007/0096191 A1* | 5/2007 | Lee et al. .................. | 257/309 |
| 2009/0179246 A1* | 7/2009 | Nakamura et al. ......... | 257/298 |
| 2010/0009508 A1* | 1/2010 | Lim et al. .................. | 438/381 |
| 2010/0065944 A1* | 3/2010 | Tu et al. .................... | 257/532 |
| 2010/0213573 A1* | 8/2010 | Han .......................... | 257/532 |

FOREIGN PATENT DOCUMENTS

| | | |
|---|---|---|
| JP | 2003-297952 | 10/2003 |
| JP | 2010-067661 | 3/2010 |

\* cited by examiner

*Primary Examiner* — Mamadou Diallo
*Assistant Examiner* — Jay C Chang
(74) *Attorney, Agent, or Firm* — Young & Thompson

(57) ABSTRACT

Capacitance blocks (first block and second block) respectively formed on two different adjacent common pad electrodes are electrically connected in series through an upper electrode. A distance between two adjacent capacitance blocks connected in series through an upper electrode film for the upper electrode corresponds to a distance between opposing lower electrodes disposed in an outermost perimeter of each capacitance block, and is two or less times than a total film thickness of the upper electrode film embedded between the two adjacent capacitance blocks.

27 Claims, 16 Drawing Sheets

SEMICONDUCTOR DEVICE AND DATA PROCESSING SYSTEM USING THE SAME

BACKGROUND OF THE INVENTION

1. Field of the Invention

The invention relates to a semiconductor device and a data processing system using the semiconductor device, and more particularly, to a semiconductor device including crown-shaped capacitors as compensation capacitance elements and a date processing system using the semiconductor device.

2. Description of the Related Art

In semiconductor devices, such as DRAM, there is an attempt to proceed with low voltage operating power supply of circuit elements, to cope with the reduction of electric power consumption. Dealing with the low voltage operation, a power supply voltage, which is supplied from an external power supply, is generally dropped to a voltage used inside semiconductor devices, and then supplied to the circuit elements.

Accompanying to a reduction of the operating power supply voltage, influence of a fluctuation of the power supply voltage to circuit operation is increased, and thus a stable supplying of the power supply voltage is critical. Therefore, a technique is known in which a compensation capacitance element is arranged between a wiring for supplying a power supply potential and a wiring for supplying a grounding potential (see JP2010-067661 A).

In addition, with respect to the invention, a technique is also known in which capacitors used in memory cells of DRAM are formed in a crown shape to use as electrodes both of internal and outer walls of lower electrodes, and a support film (support body) is provided to prevent the lower electrodes from being toppled (i.e., collapsing) during fabrication processes (see JP2003-297952 A).

By forming the capacitors in such a crown shape, electrostatic capacity thereof can be increased without increase of a footprint.

In semiconductor devices with relation to DRAM, when a compensation capacitance element is provided, capacitors having the same structure as that of capacitors used in memory cells can be arranged as a compensation capacitance element (see JP2010-067661 A).

Instead of providing planar-shaped capacitors, the capacitors having such a three-dimensional structure are used, such that a footprint of the compensation capacitance element can be reduced.

As stated above, in recent DRAMs, crown-shaped capacitors having a large electrostatic capacity are used in memory cells, accompanying to development of downscaling. As a result of intensive studies on a case in which crown-shaped capacitors are used for memory cells and a compensation capacitance element, the present inventor has found that the following problems would be caused.

In recent crown-shaped electrodes downscaled, the electrodes are supported therebetween by a support film structure as disclosed, for example, in JP2003-297952 A, such that collapsing of the electrodes can be prevented during fabrication processes. In this time, a ring shape region (i.e., a guard ring region) is provided to surround a perimeter of a region in which capacitors are disposed, and the support film connects the guard ring region with each of capacitors, and thereby supporting the capacitors. In this case, it is necessary to prepare a region required to arrange the guard ring region. When a plurality of compensation capacitance elements are arranged using the downscaled crown-shaped electrodes as described above, a guard ring region needs to be arranged on each block (hereafter, referred to as a "compensation capacitance block") in which each of compensation capacitance elements is disposed, and thereby disturbing reduction of a footprint on a semiconductor chip.

Therefore, the present inventor has studied on a structure in which a support film structure connecting the capacitors to each other only supports the capacitors, without providing a guard ring region.

When crown-shaped capacitors are arranged as the compensation capacitance element, if about 10,000 capacitors are arranged in one rectangular compensation capacitance block in the same arrangement as that of the memory cell regions, collapsing of the capacitors can only prevented by connecting adjacent electrodes by the support film, without providing a guard ring region.

In the memory cell region, capacitors more than that of the compensation capacitance block are arranged in one integrated region (i.e., a memory cell mat region), and thus, collapsing of the capacitors can similarly prevented by connecting adjacent electrodes by the support film.

In this case, depending on a voltage applied to a circuit to be connected, a higher voltage than that of capacitors used as the memory cells may be applied to the compensation capacitance element. When forming in the same shape as that of the capacitors of the memory cell region, a dielectric breakdown in a dielectric film interposed between lower and upper electrodes would be concerned, and thus, the voltage applied to each of capacitors needs to be reduced. Therefore, a plurality of compensation capacitance blocks are connected in series, such that a voltage applied to each of capacitors disposed in one compensation capacitance block can be reduced.

Also, the present inventor has studied on a case in which a plurality of compensation capacitance blocks are arranged to be connected in series without providing a guard ring region. As a result, the present inventor has found that a cavity (void) is formed in an interlayer insulating film filled between compensation capacitance blocks.

The reason is that an aspect ratio in recent crown-shaped electrodes downscaled is increased, and when the interlayer insulating film, such as silicon oxide film, covering the capacitors is formed by CVD method, the vicinity of upper portions of the electrodes is obstructed.

If the cavity is remained in the interlayer insulating film, a short circuit between adjacent contact plugs is generated through the cavity, or strength of the interlayer insulating film is decreased. Therefore, the cavity formation causes the decrease in fabrication yield.

When the compensation capacitance blocks are sufficiently spaced to each other, the cavity formation in the interlayer insulating film can be inhibited, but an area required arranging the compensation capacitance element is increased and thereby disturbing reduction of the area on a semiconductor chip.

Therefore, it is difficult to use the compensation capacitance element having crown-shaped capacitors in conventional methods.

SUMMARY

To this end, when a compensation capacitance element using three-dimensional capacitors such as crown-shaped capacitors is provided by connecting compensation capacitance blocks in series, the present inventor proposes that lower electrodes of adjacent blocks are disposed close to each other, and a gap therebetween is filled with an upper electrode.

According to one embodiment of the invention, there is provided a semiconductor device including:

a common pad electrode formed on a semiconductor substrate;

a plurality of lower electrodes disposed on the common pad;

an upper electrode formed on the plurality of lower electrodes covered with a dielectric film; and a plurality of capacitance blocks, each capacitance block comprising the common pad electrode, the plurality of lower electrodes and the upper electrode, two adjacent capacitance blocks respectively provided on two adjacent common pad electrodes being electrically connected in series through the upper electrode, a distance between the two adjacent capacitance blocks being two or less times than a total film thickness of an upper electrode film for the upper electrode embedded between the two adjacent capacitance blocks, and the distance between the two adjacent capacitance blocks corresponding to a distance between opposing lower electrodes disposed in an outermost perimeter of each capacitance block.

According to another embodiment of the invention, there is provided a semiconductor device including:

a common pad electrode provided on a semiconductor substrate;

a plurality of lower electrodes disposed on the common pad electrode;

an upper electrode formed on the plurality of the lower electrodes covered with a dielectric film;

wherein the capacitance blocks respectively provided on two adjacent common pad electrodes are electrically connected in series through an upper electrode film for the upper electrode, and a gap between the two adjacent capacitance blocks connected in series through the upper electrode film is filled with the upper electrode film without a void.

In the semiconductor device including a plurality of capacitance blocks as a compensation capacitance element, two or more compensation capacitance blocks are arranged to be connected in series, such that increase of a footprint of the compensation capacitance element can be inhibited.

Also, creation of a cavity (void) between the compensation capacitance blocks can be preventing, and thereby avoiding decrease of fabrication yield.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

Hereafter, a case in which a compensation capacitance element is disposed in an internal power supply wiring supplying a power supply voltage to a decoder circuit of DRAM will be described as an embodiment. However, the invention is not limited to such an embodiment.

First Embodiment

Figure 1:
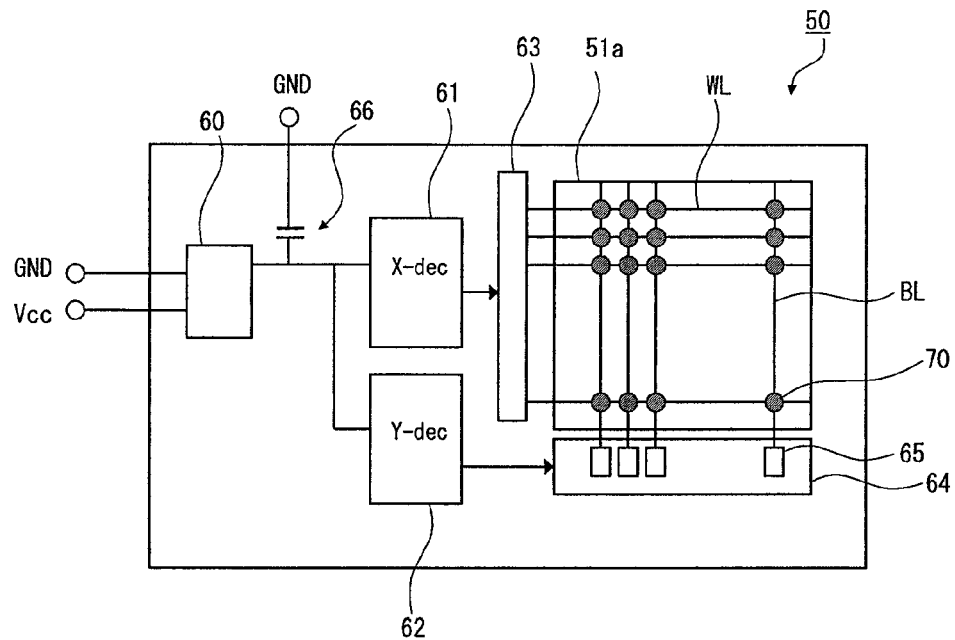
FIG. 1 is a circuit diagram showing a main portion including a decoder circuit of DRAM.

FIG. 1 is a circuit diagram showing a main portion including a decoder circuit of a DRAM.

As shown in FIG. 1, semiconductor chip 50 includes memory cell array 51a, X-decoder 61, Y-decoder 62, and internal power supply circuit 60 supplying an internal power supply voltage to each of the decoders. External power supply potential Vcc and grounding potential GND are supplied to internal power supply circuit 60 from an external of the semiconductor chip 50, and decreased (or dropped) to a predetermined voltage so as to supply the internal power supply voltage to X-decoder 61 and Y-decoder 62.

The memory cell array 51a includes a plurality of word wirings WL and a plurality of bit wirings BL, and an intersecting point between each of word wirings WL and each of bit wirings BL is provided with memory cell 70.

Memory cell 70 is constituted of a capacitor for storing data, and a MOS transistor for selecting.

In response to an address signal inputted to X-decoder 61, X-control circuit 63 is operated to select word wirings WL.

In response to an address signal inputted to Y-decoder 62, Y-control circuit 64 is operated to select bit wirings BL.

In readout operations, information stored in the capacitor of the selected memory cell 70 is amplified by sense amplifier circuit 65 and then outputted outside through bit wiring BL.

On one way of wirings which supply the internal power supply voltage from internal power supply circuit 60 to X-decoder 61 and Y-decoder 62, another grounding potential GND is connected via compensation capacitance element 66. The compensation capacitance element 66 restrains a fluctuation in the internal power supply voltage supplied to X-decoder 61 and Y-decoder 62.

Figure 2:
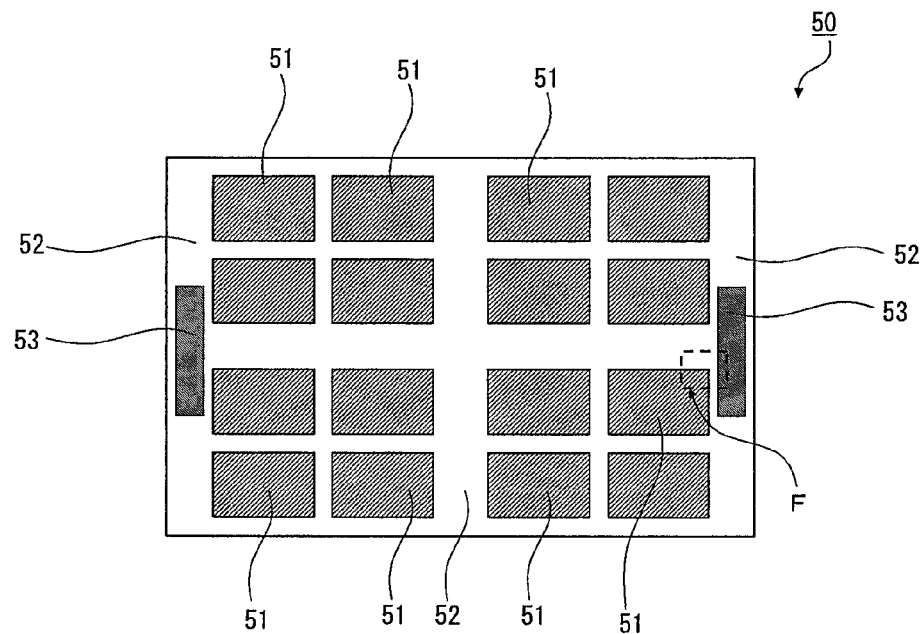
FIG. 2 is a plan diagram showing a layout in semiconductor chip 50 shown in FIG. 1.

FIG. 2 is a plan diagram showing a layout in semiconductor chip 50 illustrated in FIG. 1.

A plurality of memory cell regions 51 is disposed on semiconductor chip 50, and memory cell arrays 51a are disposed within each of memory cell regions.

Peripheral circuit regions 52 are disposed to surround each memory cell region 51. Circuit blocks other than the memory cell array, including the sense amplifier circuit, the decoder circuit and the like, are disposed in the peripheral circuit region.

Such an arrangement of FIG. 2 is shown as an example, and accordingly, the number and position of the memory cell regions are not limited to the layout in FIG. 2.

Compensation capacitance regions 53, in which compensation capacitance elements 66 are disposed, are provided on portions of the peripheral circuit regions.

Figure 3:
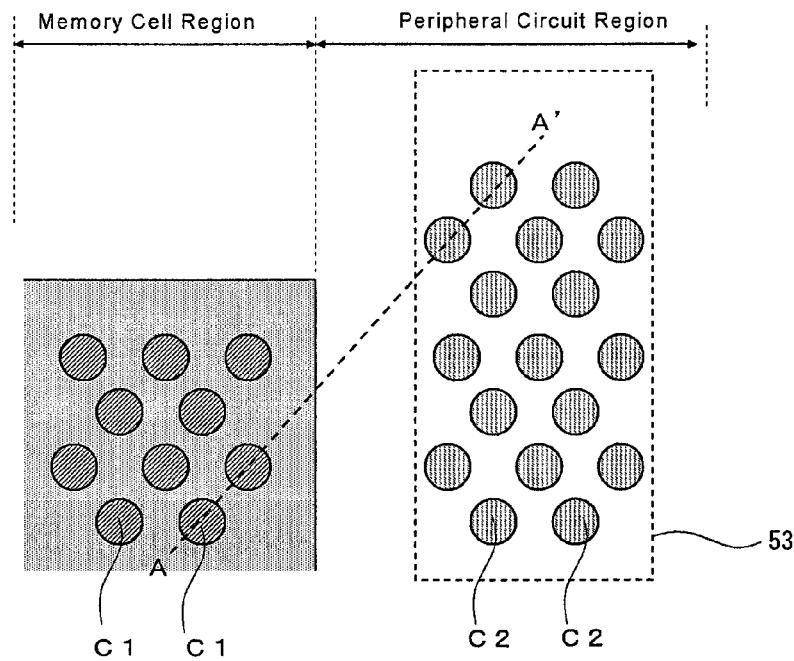
FIG. 3 is an enlarged plan diagram showing a portion of memory cell region 51 and peripheral circuit region 52 including compensation capacitance region 53.

An enlarged plan diagram of a portion of memory cell region 51 and peripheral circuit region 52 including compensation capacitance region 53, as shown by a dashed line F, is illustrated in FIG. 3.

As shown in FIG. 3, capacitors C1 constituting a memory cell of DRAM are disposed in memory cell region 51. Each capacitor C1 includes a crown-shaped electrode. The term "crown-shaped" means an electrode structure in which both of an outside wall surface and an inside wall surface in an electrode formed in a cup shape are used as a capacitor electrode.

An arrangement of the capacitors in the memory cell region 51 can be any one of layouts generally referred to 8F2, 6F2, 4F2 and the like.

A plurality of capacitors C2 constituting a compensation capacitance element are disposed in compensation capacitance region 53. Each capacitor C2 also includes a crown-shaped electrode.

In capacitors C2 disposed in the compensation capacitance region 53, lower electrodes and upper electrodes are respectively connected in common thereto to serve as one capacitor having a high electrostatic capacity.

Figure 5:
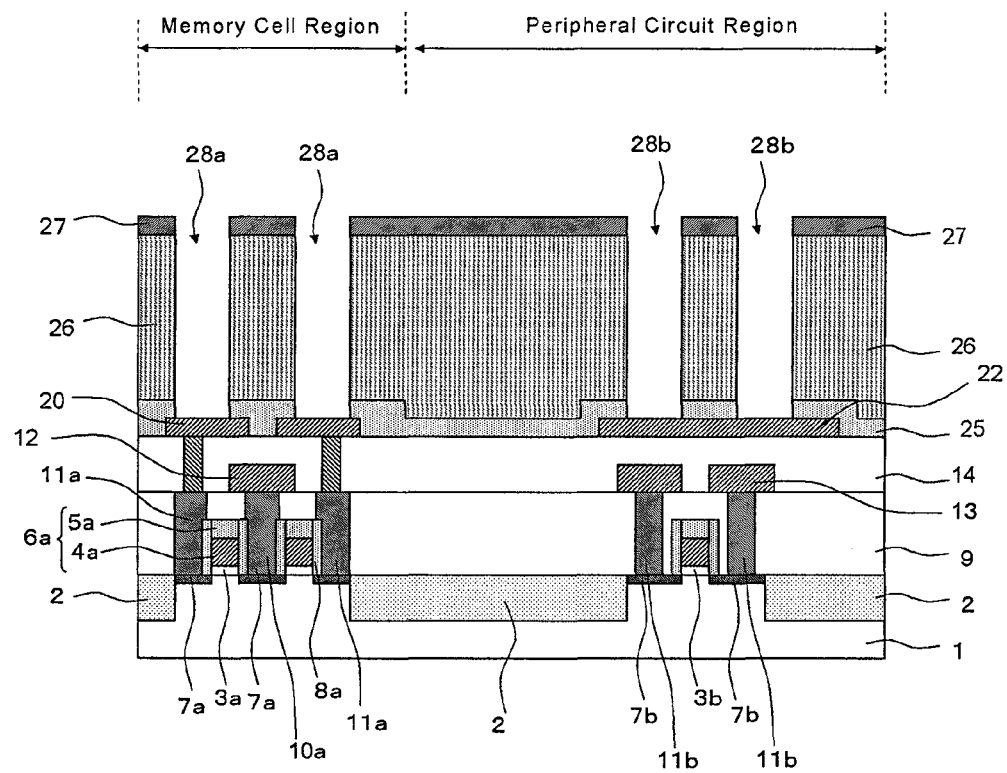
FIG. 5 is a schematic cross-sectional view illustrating a process of fabricating the semiconductor device according to one embodiment of the invention.
Figure 6:
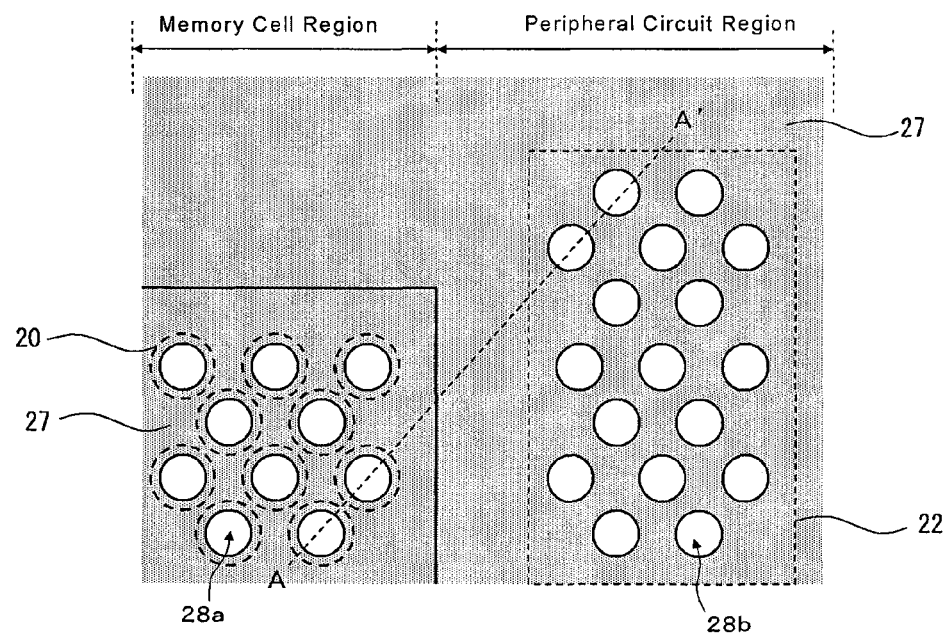
FIG. 6 is a schematic plan view showing the process of FIG. 5.
Figure 8:
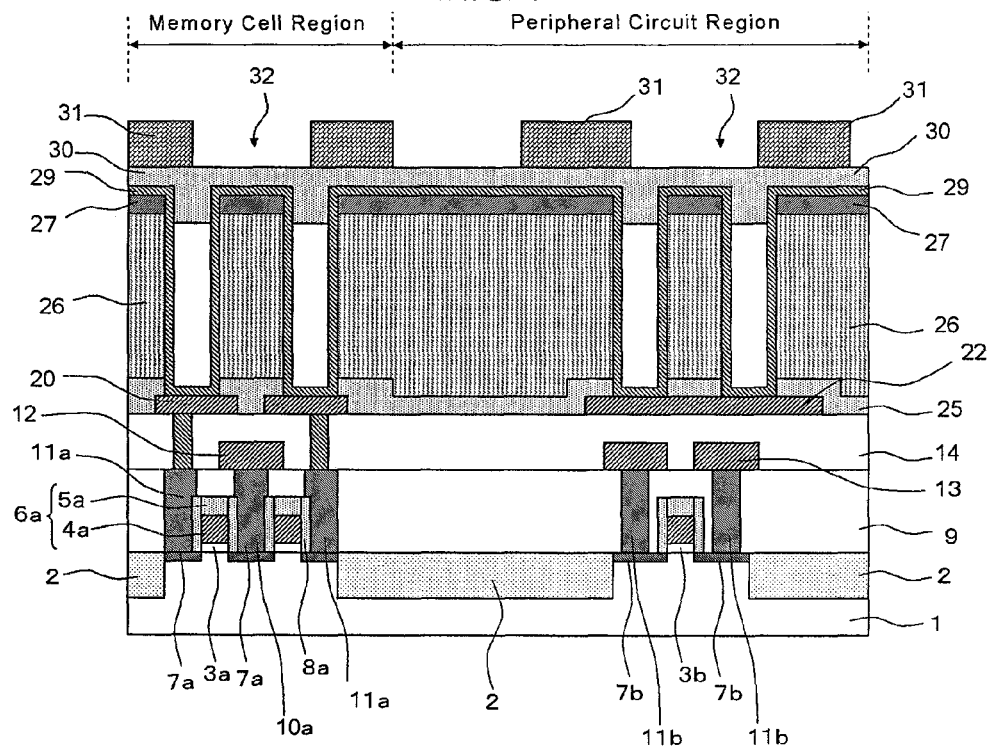
FIG. 8 is a schematic cross-sectional view illustrating a process of fabricating the semiconductor device according to one embodiment of the invention.
Figure 9:
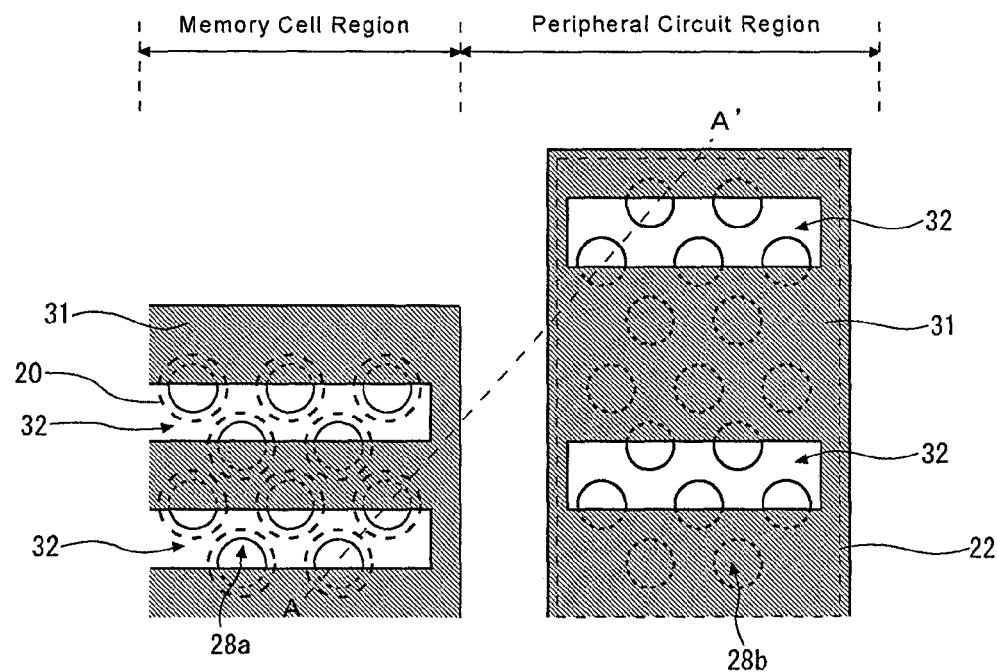
FIG. 9 is a schematic plan view showing the process of FIG. 8.
Figure 11:
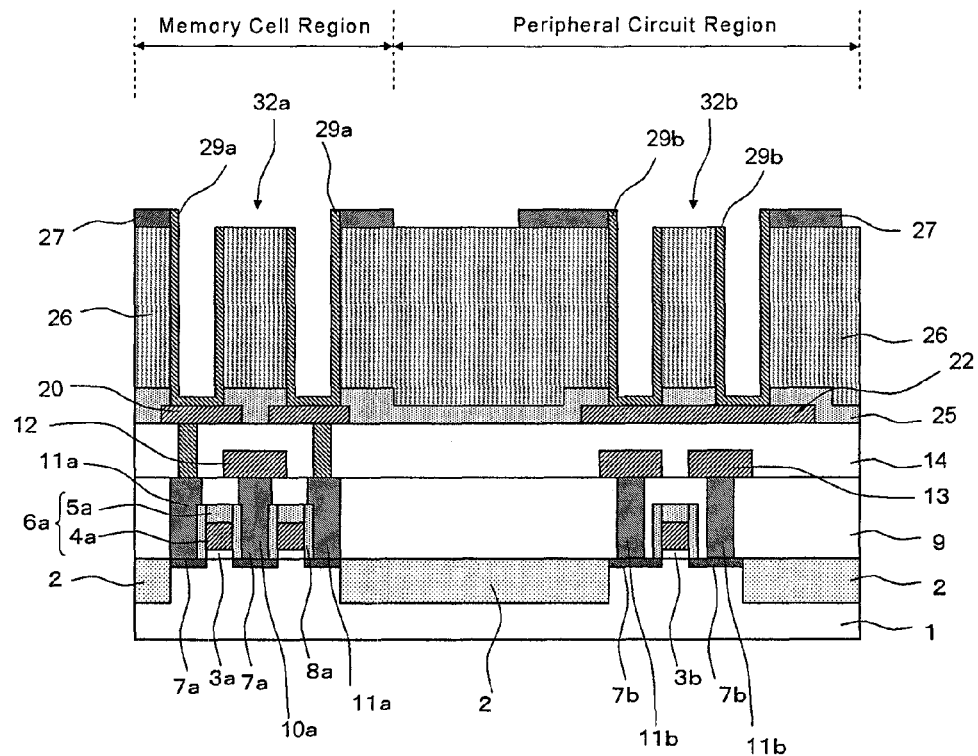
FIG. 11 is a schematic cross-sectional view illustrating a process of fabricating the semiconductor device according to one embodiment of the invention.
Figure 12:
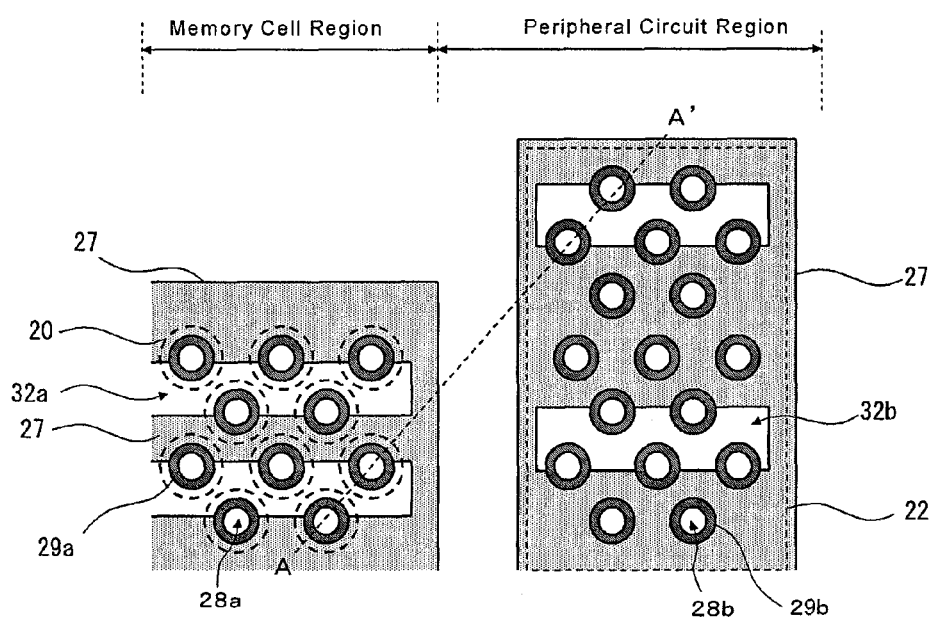
FIG. 12 is a schematic plan view showing the process of FIG. 11

Next, a fabrication method will be described using cross-sectional views (FIGS. 4 to 16, but FIGS. 6, 9, and 12 are plan views) taken along a line A-A'. In addition, memory cell region 51 and peripheral circuit region 52 including compensation capacitance region 53 will be concurrently processed, unless specifically indicated otherwise.

Figure 4:
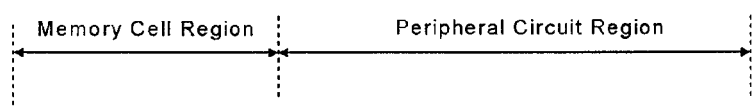
FIG. 4 is a schematic cross-sectional view illustrating a process of fabricating a semiconductor device according to one embodiment of the invention.
Figure 4:
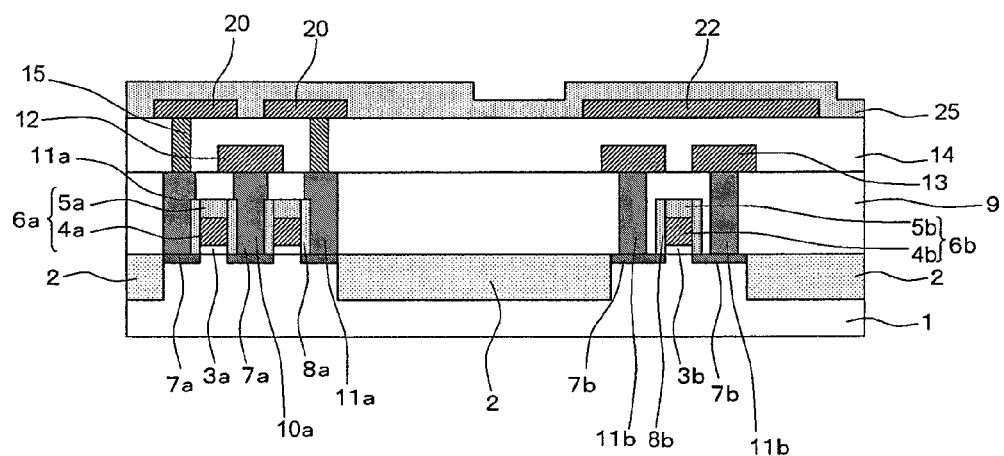

(Process of FIG. 4)

Element isolation 2 is formed in semiconductor substrate 1 made of P-type silicon (Si) by STI (Shallow Trench Isolation) method. A region delimited in semiconductor substrate 1 by element isolation 2 becomes into an active region, in which a MOS transistor is disposed.

In the embodiment, a case in which a MOS transistor of planar type is formed will be described. However, a MOS transistor having a trench gate electrode, or a vertical MOS transistor can also be utilized.

As described below, the peripheral circuit region has a structure in which the MOS transistor is disposed below the compensation capacitance element, such that a footprint of a circuit on the semiconductor chip can be reduced. However, the invention can be applied to a case in which the MOS transistor is not disposed below the compensation capacitance region.

In the memory cell region, gate insulating film 3a, gate electrode 6a formed by patterning a lamination of gate conductive film 4a and protective insulating film 5a, impurity diffusion layer 7a formed by introducing an N-type impurity into semiconductor substrate 1, and sidewall insulating film 8a formed as an insulating film on a lateral surface of gate electrode 6a are disposed. A part of a word wiring serves as gate electrode 6a. Impurity diffusion layer 7a serves as a source or drain electrode of the MOS transistor.

Similarly, in the peripheral circuit region, gate insulating film 3b, gate electrode 6b formed by patterning a lamination of gate conductive film 4b and protective insulating film 5b, impurity diffusion layer 7b formed by introducing an N-type impurity into semiconductor substrate 1, and sidewall insulating film 8b formed as an insulating film on a lateral surface of gate electrode 6b are disposed. Impurity diffusion layer 7b serves as a source or drain electrode of the MOS transistor. Although the MOS transistor of N-channel type is only illustrated by way of example in the peripheral circuit region, an N-type well can be formed in semiconductor substrate 1, and a MOS transistor of P-channel type can be disposed thereon.

A material of gate insulating films 3a and 3b includes, for example, silicon oxide (SiO$_2$).

A material of gate conductive films 4a and 4b includes, for example, phosphorus-doped polycrystalline silicon, tungsten (W), tungsten silicide (WSi), and a lamination thereof.

A material of protective insulating films 5a and 5b and sidewall insulating films 8a and 8b includes, for example, silicon nitride (Si$_3$N$_4$).

First interlayer insulting film 9 such as a silicon oxide film is formed to cover gate electrodes 6a and 6b. A top surface of first interlayer insulating film 9 is polished and planarized by CMP method.

Cell contact plug 11a, which is connected to impurity diffusion layer 7a of the memory cell region, is formed by a phosphorus-doped polycrystalline silicon film and the like. When cell contact plug 11a is formed, SAC (Self-Alignment Contact) method using protective insulating film 5a of gate electrode 6a and sidewall insulating film 8a can be utilized.

Peripheral contact plug 11b, which is connected to impurity diffusion layer 7b of the peripheral circuit region, is formed by metal such as tungsten.

Bit wiring 12, which is connected to one of source and drain electrodes of the MOS transistor through cell contact plug 11a, is formed in the memory cell region. A material of bit wiring 12 includes, for example, a lamination of tungsten nitride (WN) and tungsten (W).

While forming bit wiring 12, peripheral wiring 13, which is connected to each of source/drain electrodes of the MOS transistor through peripheral contact plug 11b, is formed in the peripheral circuit region. Although not shown, a contact plug, which is connected to gate conductive film 4b of the peripheral circuit region, and a wiring layer can be simultaneously formed.

Second interlayer insulating film 14 such as a silicon oxide film is formed to cover bit wiring 12 and peripheral wiring 13. A top surface of second interlayer insulating film 14 is polished and planarized by CMP method Capacitor contact plug 15, which extends through second interlayer insulating film 14 and is connected to cell contact plug 11a, is formed by a conductor such as tungsten in the memory cell region.

A lamination formed by successively depositing a tungsten nitride film and a tungsten film is patterned, such that pad electrodes 20 (hereafter, referred to as "pad") are formed in the memory cell region, and common pad electrode 22 (hereafter, referred to as "common pad") is formed in the peripheral circuit region. Pads 20 in the memory cell region are respectively connected to each capacitor contact plug 15. Common pad 22 is disposed to a location (i.e., the compensation capacitance region 53) where the compensation capacitance element is provided. Contrary to pads 20 of the memory cell region, common pad 22 is disposed as one large pad to connect lower electrodes of each capacitor for the compensation capacitance element with each another.

Meanwhile, in the following description to the fabrication method, an example in which only one block for the compensation capacitance element is disposed will be illustrated as cross-sectional views.

Stopper film 25 is formed by depositing a silicon nitride film having a film thickness of 40 to 100 nm using LP-CVD method or ALD method to cover pads 20 and common pad 22. Stopper film 25, when a wet etching (described below) is performed while forming a crown-shaped electrode, serves as a stopper to prevent an etchant to be used from downwardly permeating.

(Process of FIG. 5)

Third interlayer insulating film 26 having a film thickness of 1 to 2 μm and support film 27 having a film thickness of 50 to 150 nm are successively deposited on stopper film 25.

A material of third interlayer insulating film 26 includes, for example, silicon oxide, BPSG containing impurities, and a lamination thereof.

A material of support film 27 includes, for example, silicon nitride deposited by LP-CVD method or ALD method. Support film 27, when a wet etching (described below) is performed while forming a crown-shaped electrode, has a function of supporting to prevent the electrode from collapsing.

Next, by performing an anisotropic dry etching, holes 28a and 28b are simultaneously formed to extend through support film 27, third interlayer insulating film 26, and stopper film 25, such that the holes 28a expose top surfaces of pads 20 in the memory cell region, and holes 28b expose a top surface of common pad 22 in the peripheral circuit region.

A schematic plan view after forming holes 28a and 28b is shown in FIG. 6.

Holes 28a in the memory cell region define locations of lower electrodes of capacitors used in the memory cell region. Similarly, holes 28b in the peripheral circuit region define locations of lower electrodes of capacitors used in the peripheral circuit region.

The film thickness of third interlayer insulating film 26 defines a height of the capacitors and affects to electrostatic capacity thereof.

Increase of the film thickness of third interlayer insulating film 26 can increase the electrostatic capacity, but be difficult to form holes 28a and 28b. Therefore, the film thickness is preferably set such that an aspect ratio of holes 28a and 28b is in a range of 15 to 25.

In the peripheral circuit region, a plurality of holes 28b is provided on common pad 22. In memory cell region, each of holes 28a is provided on each pad 20.

Meanwhile, the embodiment illustrates an example in which holes 28a and 28b are formed at a same size (diameter). Although the sizes or plan geometries of holes 28a and 28b are preferably identical each other in terms of processability, the invention can be applied to a case in which the sizes or plan geometries are different each other.

Figure 7:
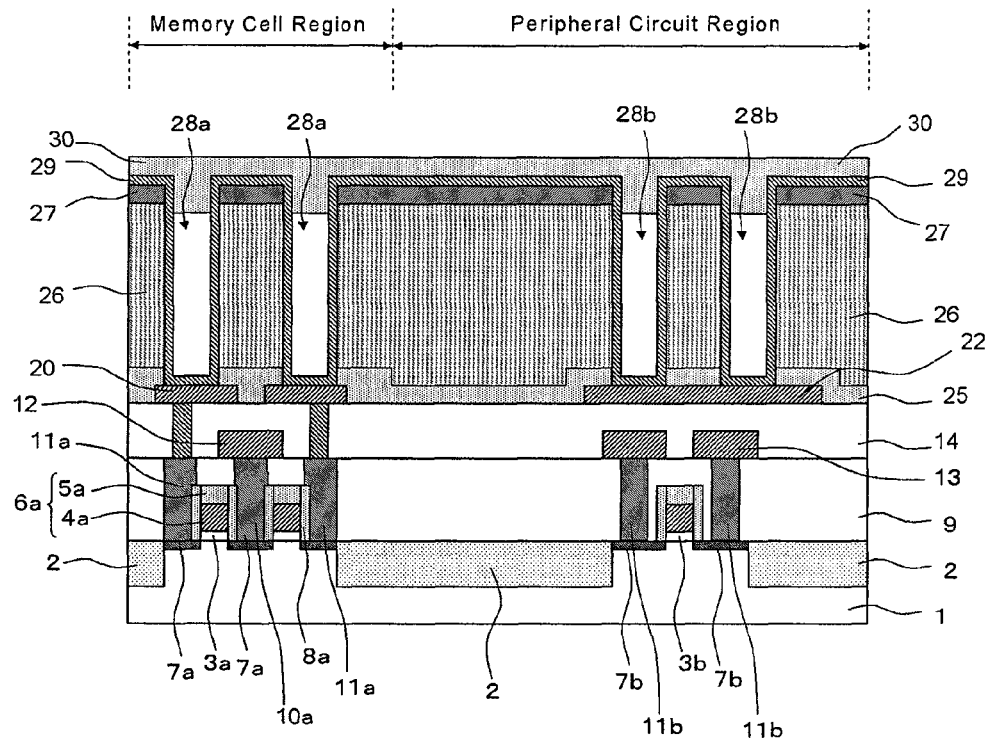
FIG. 7 is a schematic cross-sectional view illustrating a process of fabricating the semiconductor device according to one embodiment of the invention.

(Process of FIG. 7)

Lower electrode film 29 for the capacitors is formed by depositing a metal film using CVD method. A material of the lower electrode includes, for example, titanium nitride (TiN). Lower electrode film 29 is formed at a thickness not completely filling inside holes 28a and 28b (e.g., the thickness of the lower electrode film is in a range of 10 to 20 nm, when holes 28a and 28b have a diameter of 80 nm).

Next, cap insulating film 30 made of a silicon nitride film (SiN) is formed on lower electrode film 29 by a method having a poor step coverage, such as plasma CVD method. In holes 28a and 28b, cap insulating film 30 is come into only the vicinity of upper ends of the holes. The reason is that, when cap insulation film 30 is formed by a method having a poor step coverage, such as plasma CVD method, in devices downscaled at the design rule of 65 nm generation or later, upper ends of each of the holes are firstly obstructed such that the film is not deposited inside the holes. Meanwhile, because cap insulating film 30 is removed in subsequent processes, it is not necessary to completely prevent attachment to inside walls of holes 28a and 28b.

(Process of FIG. 8)

Photoresist film 31 is formed on cap insulating film 30. Photoresist film 31 has aperture patterns 32 in the memory cell region. Locations of aperture patterns 32 correspond to location where window patterns are formed on support film 27 to allow an etchant to be permeated when a wet etching is performed to remove third interlayer insulating film 26.

In this case, by firstly forming cap insulating film 30, an intrusion of photoresist film 31 into each of the holes can be prevent. Therefore, a patterning of photoresist film 31 using an expose process can be easily preformed, and photoresist film 31 is not filled in holes 28a and 28b such that photoresist film 31 can be easily removed after the patterning.

FIG. 9 is shown an arrangement example of aperture patterns 32 formed in photoresist film 31.

In the embodiment, aperture patterns 32 include a plurality of rectangular patterns arranged in parallel to each other in the memory cell region and the compensation capacitance region. Also, photoresist film 31 is only formed to cover the memory cell region and the compensation capacitance region. Portions other than the compensation capacitance region in the peripheral circuit region are not covered by photoresist film 31.

Meanwhile, the aperture patterns 32 shown are an example, and longitudinal portions of the aperture patterns can be disposed in an oblique direction, for example, along the line A-A'.

Figure 10:
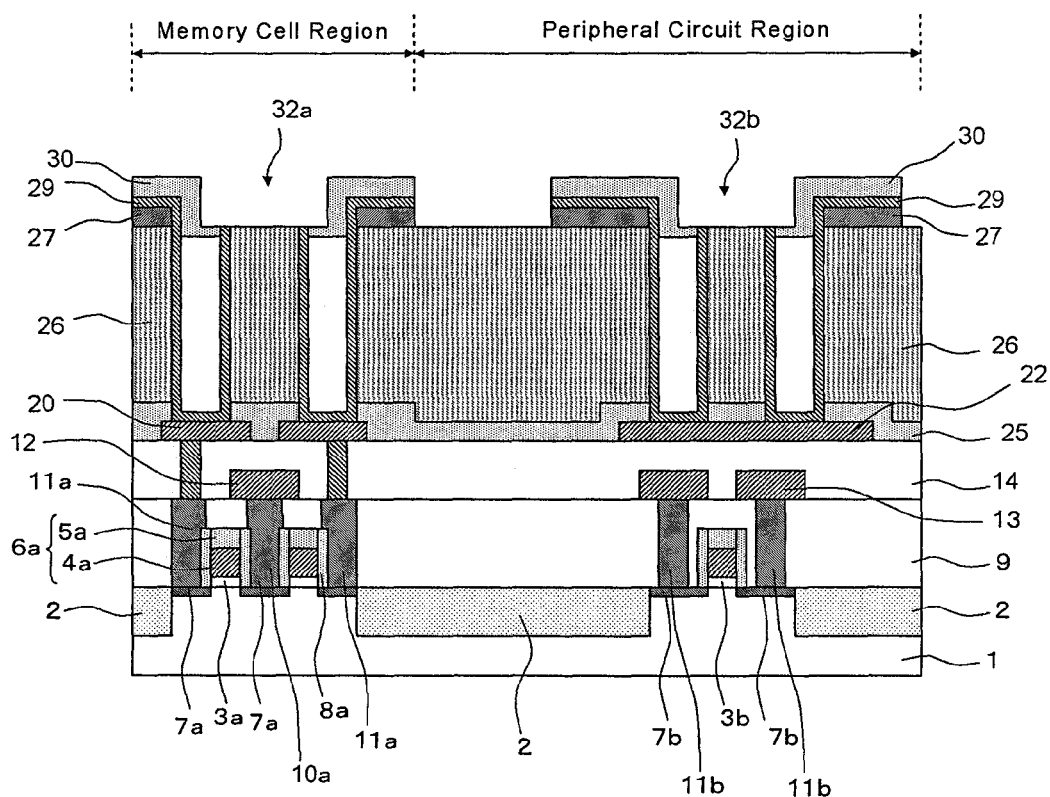
FIG. 10 is a schematic cross-sectional view illustrating a process of fabricating the semiconductor device according to one embodiment of the invention.

(Process of FIG. 10)

By performing an anisotropic dry etching using photoresist film 31 as a mask, cap insulating film 30, lower electrode 29, and support film 27 in portions not covered with photoresist film 31 are removed. As a result, the window patterns (apertures 32a and 32b) are formed in portions of support film 27 corresponding to aperture patterns 32. In addition, support film 27 is remained to connect electrodes of adjacent individual capacitors each other.

Then, photoresist film 31 is removed by plasma ashing method.

(Process of FIG. 11)

Cap insulating film 30 remained and lower electrode film 29 located outside holes 28a and 28b are removed by a dry etching. In this time, when the aspect ratio of the holes is high (i.e., 15 or higher), the dry etching can remove lower electrode film 29 on the support film without damaging a portion of lower electrode film 29 located in bottoms of the holes.

By a processing as described above, as shown in a plan view of FIG. 12, lower electrodes 29a covering the internal walls of holes 28a are formed in the memory cell region, and lower electrodes 29b covering the internal walls of holes 28b are formed in the peripheral circuit region.

Support film 27 remained in the memory cell region contacts with outside walls of lower electrodes 29a, and serves as a supporter for integrally supporting the lower electrodes when performing a wet etching as described below.

Also, support film 27 remained in the peripheral circuit region (the compensation capacitance region) contacts with outside walls of lower electrodes 29b, and serves as a supporter for integrally supporting the lower electrodes when performing a wet etching as described below.

Figure 13:
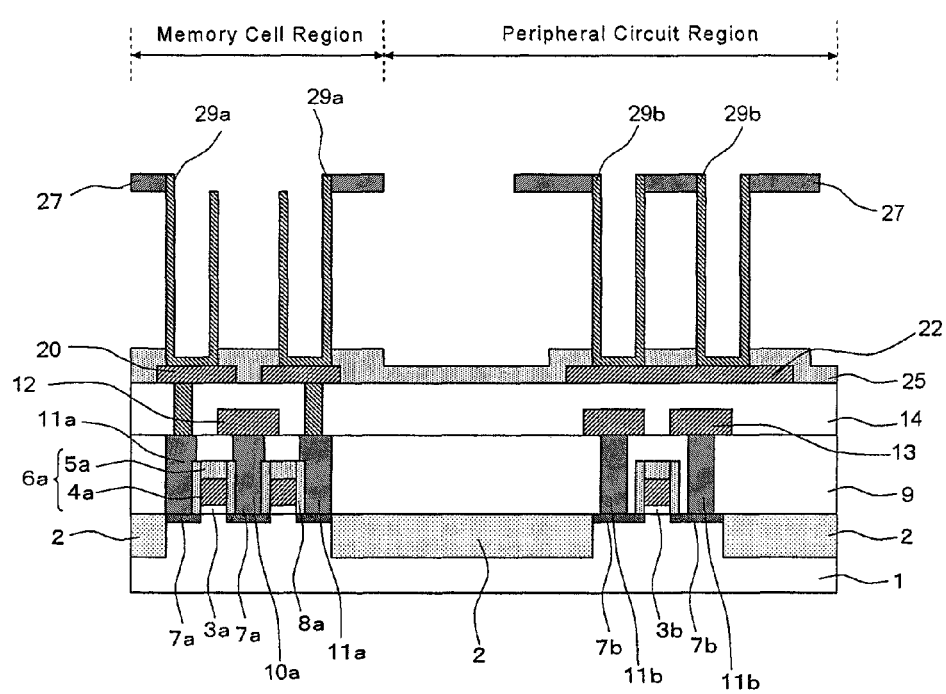
FIG. 13 is a schematic cross-sectional view illustrating a process of fabricating the semiconductor device according to one embodiment of the invention.

(Process of FIG. 13)

Third interlayer insulating film 26 in the memory cell region is removed by performing a wet etching using a hydrofluoric acid (HF) as an etchant.

As a hydrofluoric acid solution, a solution having a concentration of 49 wt % is preferably used because a time taken in the wet etching can be reduced. The hydrofluoric acid solution having such a concentration corresponds to an undiluted solution of hydrofluoric acid typically supplied for industrial use, and thereby the undiluted solution can be directly used.

When performing the wet etching, the silicon nitride film formed by LP-CVD method or ALD method has a resistance to the hydrofluoric acid. Therefore, a permeation of the etchant into other layers below stopper film 25 can be prevented. As a result, third interlayer insulating film 26 in the memory cell region and the peripheral circuit region can be removed without damaging elements, such as the MOS transistor, already formed.

Meanwhile, the silicon nitride film formed as cap insulating film 30 in the process of FIG. 7 above is formed by plasma CVD method, and thereby forming a film having not a resistance to the hydrofluoric acid. Therefore, even when cap insulating film 30 is remained on inner surfaces of lower electrodes 29a and 29b, cap insulating film 30 can be completely removed by the wet etching process.

By the wet etching, outside walls of lower electrodes 29a disposed in the memory cell region are exposed to form crown-shaped electrodes. In this time, lower electrodes 29a are retained as one integral body by support film 27, and thereby preventing each of the lower electrodes from being collapsed.

Similarly, outside walls of lower electrodes 29b disposed in the peripheral circuit region (i.e., the compensation capacitance region) are also exposed to form crown-shaped electrodes. In this time, lower electrodes 29b are retained as one integral body by support film 27, and thereby preventing each of the lower electrodes from being collapsed. Meanwhile, lower electrodes 29b disposed in the peripheral circuit region (i.e., the compensation capacitance region) can be decreased in support strength as a whole, if the number of lower electrodes 29b disposed as the one integral body is too small. Therefore, at least 8,000 or more of lower electrodes 29b are preferably integrated and disposed in one block of the compensation capacitance region.

For the memory cell region, 100,000 or more lower electrodes 29a are typically integrated and disposed in one memory mat area, and thereby providing a sufficient support strength as a whole.

Figure 14A:
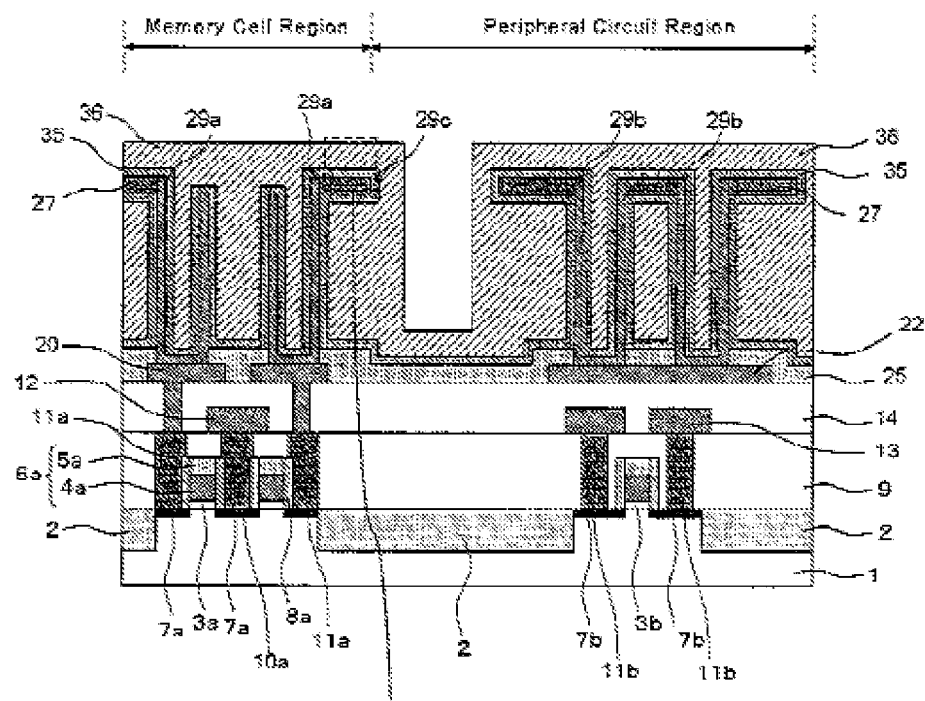
FIG. 14A is a schematic cross-sectional view illustrating a process of fabricating the semiconductor device according to one embodiment of the invention.

(Process of FIG. 14)

Dielectric film 35 is formed in a film thickness of 6 to 10 nm to cover surfaces including lower electrodes 29a and 29b exposed thereon. A material of dielectric film 35 includes, for example, a high dielectric material, such as zirconium oxide ($ZrO_2$), hafnium oxide ($HfO_2$), and aluminum oxide ($Al_2O_3$), or a lamination thereof. Dielectric film 35 can be formed by ALD method.

Upper electrode film 36 is formed to cover dielectric film 35.

Figure 14B:
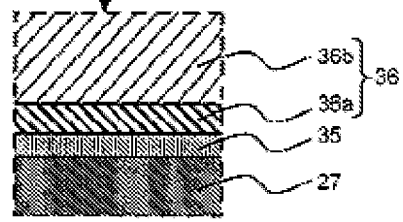
FIG. 14B is an enlarged diagram of a portion surrounded by a dashed line in FIG. 14A.

Upper electrode film 36 needs to fill gaps between the lower electrodes, and thereby having a stacked structure as shown in FIG. 14B.

Firstly, a metal film 36a, such as titanium nitride (TiN), is formed in a film thickness of 5 to 10 nm as a material for a lowest layer. In the step of forming the metal layer for such a lowest layer, the gaps between the lower electrodes are not filled. Then, gaps remained between the lower electrodes are filled by forming a polycrystalline silicon film 36b containing impurities.

The polycrystalline silicon film can fill the gaps remained between the lower electrodes without a void, because the polycrystalline silicon film is deposited as a film having a better covering ability (coverage) on stepped portions by LP-CVD method. Even in portions covered with support film 27 in FIG. 12, the gaps between the lower electrodes can be filled because the polycrystalline silicon film is formed through the apertures 32a and 32b.

Phosphorus or boron can be used as an impurity (dopant) introduced into the polycrystalline silicon film and can decrease an electric resistance by forming N or P conductive type. Alternatively, other impurity elements than phosphorous or boron can be added as an impurity.

Also, after the gaps between the lower electrodes are filled with the polycrystalline silicon film, a metal film, such as tungsten, can be additionally deposited in a film thickness of 70 to 100 nm on the polycrystalline silicon film.

Furthermore, the metal film used in the lowest layer for the upper electrodes can use other metals (e.g., ruthenium and the like) than titanium nitride, and be selected according to electrical properties desired to capacitors to be formed.

Figure 15:
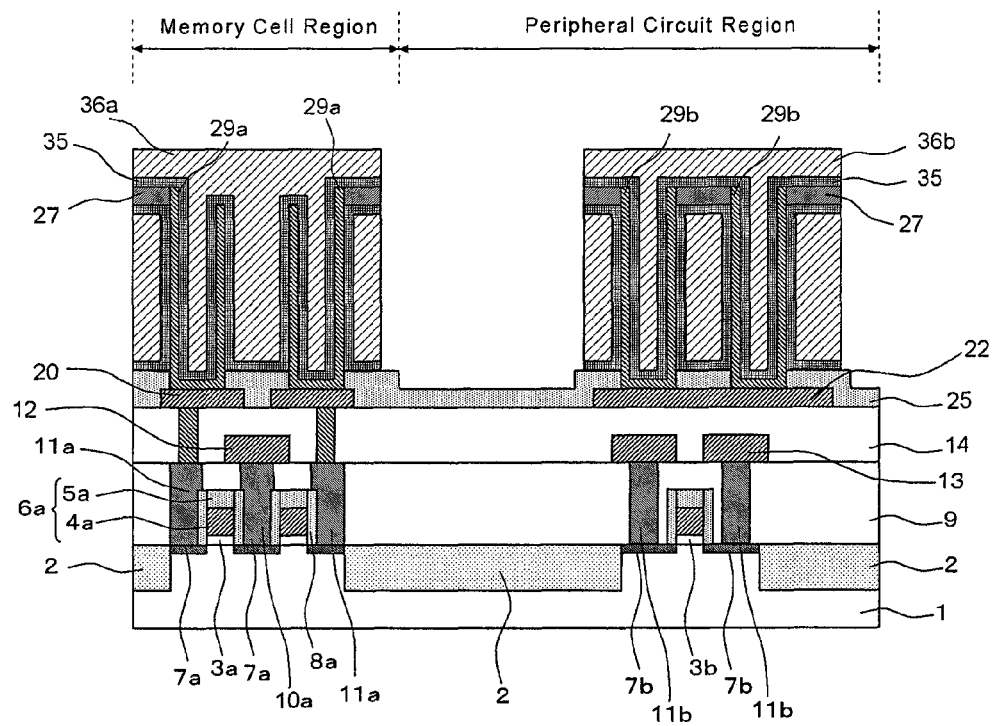
FIG. 15 is a schematic cross-sectional view illustrating a process of fabricating the semiconductor device according to one embodiment of the invention.

(Process of FIG. 15)

By patterning upper electrode film 36 with dielectric film 35, upper electrode 36a of the memory cell region and upper electrode 36b of the peripheral circuit region are formed.

Figure 16:
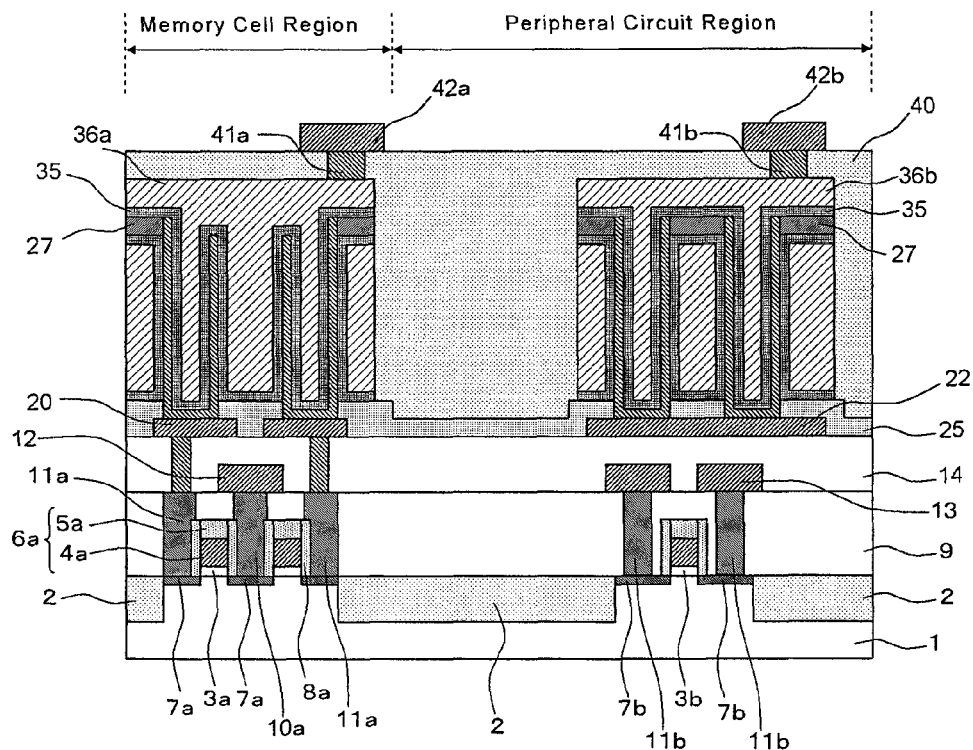
FIG. 16 is a schematic cross-sectional view illustrating a process of fabricating the semiconductor device according to one embodiment of the invention.

(Process of FIG. 16)

Fourth interlayer insulating film 40 such as a silicon oxide film is formed to cover upper electrodes 36a and 36b. A top surface of fourth interlayer insulating film 40 is polished and planarized by CMP method.

Contact plug 41a connected to upper electrode 36a and contact plug 41b connected to upper electrode 36b are simultaneously formed.

Next, metal wirings 42a and 42b respectively connected to contact plug 41a and 41b is formed from metal such as aluminum (Al) and copper (Cu).

Also, although not shown, a contact plug, which is connected to the MOS transistor disposed in the peripheral circuit region, and a wiring layer formed thereon can be formed as described above.

When a surface protective film (not shown) and the like have been formed, the semiconductor device is completed.

Next, a configuration of the compensation capacitance element will be described in detail.

Figure 17:
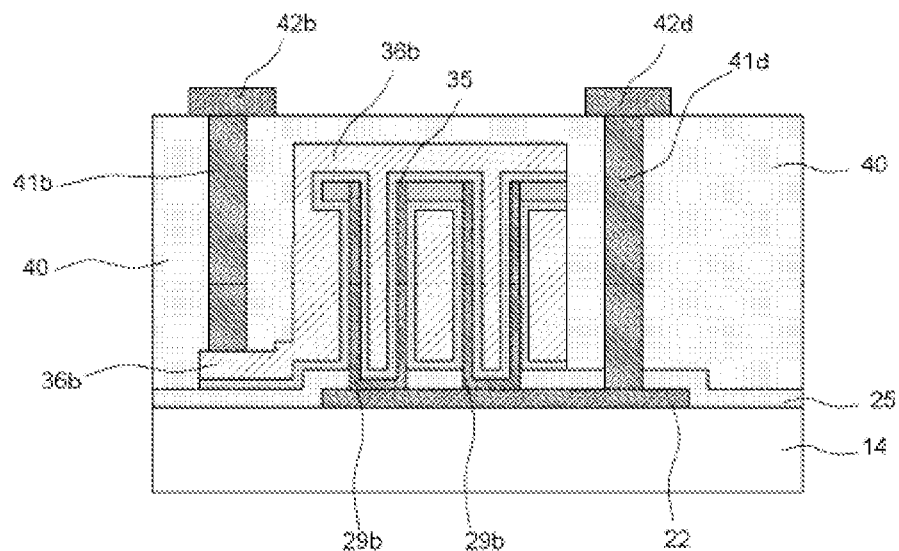
FIG. 17 is a schematic cross-sectional view illustrating a configuration of a compensation capacitance element according to one embodiment of the invention.

The compensation capacitance element is used as one capacitor that which combines a plurality of capacitors respectively formed by each of crown shaped lower electrodes 29b. In FIG. 17, a portion located above second interlayer insulating 14 is only shown in a cross-sectional view.

A plurality of lower electrodes 29b is provided to be connected to common pad 22.

The number of lower electrodes 29b disposed on common pad 22 can be determined according to an electrostatic capacity required to the compensation capacitance element. For example, the number of lower electrode 29b disposed per one block is 8000 or more as described above. For example, the number of lower electrodes 29b disposed on one common pad 22 can be about 10,000. In addition, a plurality of blocks can be disposed on one common pad 22 as described below.

In the configuration of FIG. 7, extraction wiring 42b connected to common upper electrode 36b, and extraction wiring 42d connected to common pad 22 are provided.

Contact plug 41b connected to upper electrode 36b can be either connected to upper electrode 36b extending in a traverse direction (a direction generally parallel to the surface of the substrate) as shown in FIG. 17, or disposed over lower electrode 29b as shown in FIG. 16.

Numeral reference 41d means a contact plug connecting common pad 22 to extraction wiring 42d. Contact plug 41d can be simultaneously formed with contact plug 41b. When simultaneously forming, contact plug 41b is disposed to be connected to upper electrode 36b extending in the traverse direction as shown in FIG. 17, such that depths of the contact plugs can be identical and thus a processing thereof can be easy.

The capacitors serves as a compensation capacitance element having a predetermined electrostatic capacity by applying a grounding potential to one of extraction wirings 42b and 42d and connecting other of extraction 42b and 42d to a power supply wiring.

One compensation capacitance block is configured as shown in FIG. 17.

Figure 18:
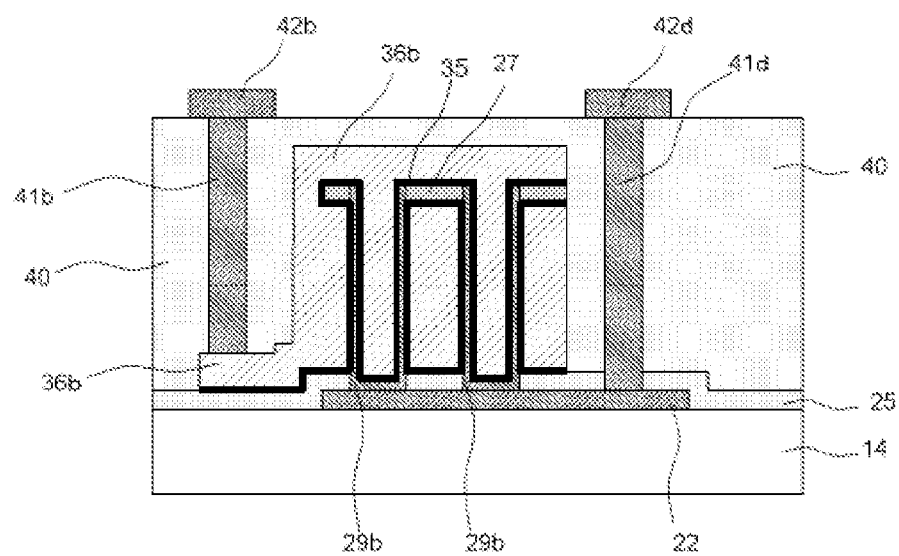
FIG. 18 is a cross-sectional view simplifying the configuration of FIG. 17.

In the following descriptions, for the sake of simplifying the drawings, a cross-sectional view of the compensation capacitance block is illustrated as in FIG. 18 in which the dielectric film is depicted by fat solid lines.

Now, an example in which a plurality of compensation capacitance blocks is connected in series will be described.

Figure 19:
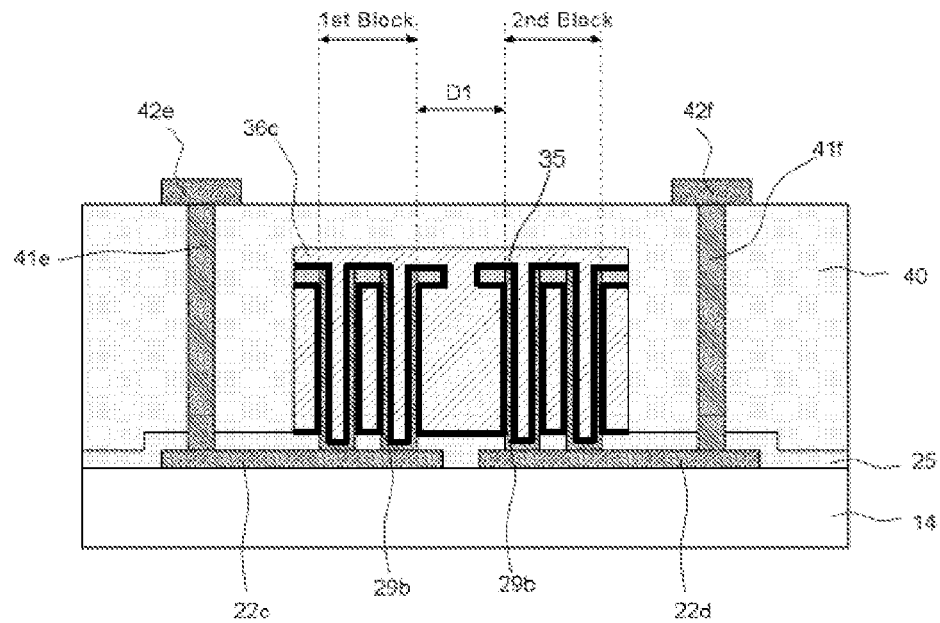
FIG. 19 is a schematic cross-sectional view showing an example of a serial connection of two compensation capacitance blocks.

FIG. 19 is a cross-sectional view showing an example of a serial connection of two compensation capacitance blocks according to the invention.

The compensation capacitance elements are disposed to be divided into a first block on a left side of the figure and a second block on a right side of the figure. The first and second blocks are respectively corresponding to the block of the compensation capacitance element as shown in FIG. 18.

Common pads 22c and 22d are independently provided in the first and second blocks.

Upper electrode 36c is provided in common in the first and second blocks. Therefore, the compensation capacitance elements in each of the blocks are arranged in series through upper electrode 36c.

Extraction wiring 42e is connected to common pad 22c of the first block through contact plug 41e.

Extraction wiring 42f is connected to common pad 22d of the second block through contact plug 41f.

One of extraction wirings 42e and 42f is connected to grounding potential and the other is connected to a power supply wiring so as to serve the capacitors as a compensation capacitance element having a predetermined electrostatic capacity.

According to the configuration in which a plurality of blocks are connected in series as described above, a voltage applied to each of capacitors disposed in one compensation capacitance element can be decreased. Therefore, even when a voltage applied to dielectric film 35 is too high in a case of having only one compensation capacitance block as shown in FIG. 18 such that a dielectric breakdown in dielectric film 35 can be concerned, two blocks are arranged in series as shown in FIG. 19 such that a voltage applied to each of blocks can be decreased in half, and thereby allowing the capacitors to use as a compensation capacitance element.

The invention is characterized in that, when two blocks are arranged in series as shown in FIG. 19, the blocks are disposed close to each other such that a gap between the blocks can be filled with upper electrode 36c.

In FIG. 19, a distance between lower electrodes 29b disposed in an outermost perimeter of each block is indicated to D1.

In order to fill a gap portion having distance D1 with the upper electrode film, distance D1 can be set to be two or less times than a film thickness (a total film thickness of a metal film and a polycrystalline film formed thereon) of the upper electrode film to be deposited.

For example, when the total film thickness of the upper electrode film embedded between adjacent two blocks is 150 nm, the two blocks can be disposed such that distance D1 is 300 nm or less.

Increase of the total film thickness of the upper electrode film can be difficult in patterning process thereof. Also, if the film thickness is too thin, electrical resistance can be increased. Therefore, for DRAM of a generation of the design rule 65 nm or later, the total film thickness embedded between two blocks is preferably in a range of 100 to 300 nm. When the total film thickness of the upper electrode film is set in a range of 100 to 300 nm, distance D1 is set in a range of 600 nm or less, and two or less times than the total film thickness of the upper electrode film, because distance D1 has to be set two or less times than the total film thickness of the upper electrode film. Meanwhile, if distance D1 is too small, isolation between common pads may be difficult. Therefore, a distance between opposing end surfaces of the common pads is set larger than a minimum featuring size F according to a design rule, and larger than that of adding a margin from each of end surfaces to the lower electrodes disposed on the outermost layer. Typically, the distance is set one or more times the total film thickness of the upper electrode film, and preferably 1.5 or more times the total film thickness. Therefore, in the range of the film thickness of the upper electrode film described above, the distance is set 100 nm or more, i.e., one or more times the total film thickness, and preferably, 150 nm or more, i.e., 1.5 or more times the total film thickness.

Figure 20:
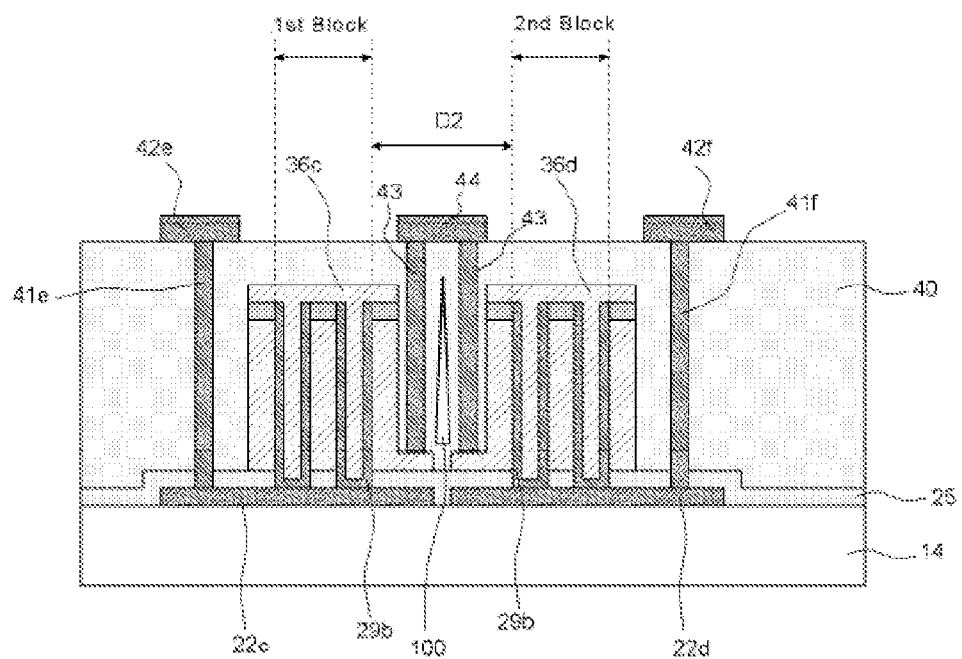
FIG. 20 is a schematic cross-sectional view showing a conventional example of arrangement of two compensation capacitance blocks.

As comparative example, a case in which two compensation capacitance blocks are arranged according to a conventional method is shown in a cross-sectional view in FIG. 20.

In the conventional method, a first and second compensation capacitance blocks are connected in series through contact plugs 43 and connecting wiring 44 respectively connected to each of upper electrodes 36c and 36d.

A distance between lower electrodes 29b disposed in an outermost perimeter of each block is indicated to D2.

According to the related art, in order to provide plugs forming area to allow a serial connection, distance D2 is set two or more times than the film thickness of upper electrodes 36c and 36d, and fourth interlayer insulating film 40 is embedded in a gap between the blocks. In order to decreases a footprint of the compensation capacitance element, it is necessary to position the first block and the second block sufficiently close to each other. By doing so, cavity (void) 100, in which fourth interlayer insulating film 40 is not filled, can be remained in the gap between the blocks. The reason is that, when a silicon oxide film generally used as an interlayer insulating film is formed by CVD method, an upper end of the gap is obstructed by the silicon oxide film due to a poor coverage.

Meanwhile, when a spin-on-dielectric (SOD) film, such as polysilazane, is filled, such a cavity is not formed, but a high temperature treatment for solidifying is required. Therefore, there are problems, such as a characteristic degradation of capacitors, and thus such an interlayer insulating film cannot be used.

Also, if distance D2 is set sufficiently large, the cavity remained in the interlayer insulating film can be avoided. However, for DRAM of a generation of the design rule 65 nm or later, in which a ratio of bottom width to height of the lower electrode, i.e., an aspect ratio is 15 or higher, distance D2 needs to set 2 μm or more, and thus the footprint of the compensation capacitance element is increased.

On the contrary, the invention has a configuration in which the first and second compensation capacitance blocks are connected in series through the upper electrode and arranged close to each other within two or less times of the film thickness of the upper electrode, such that the gap between the blocks can be filled with the upper electrode. By such a configuration, a cavity (void) cannot be created between the first and second compensation capacitance blocks, and the compensation capacitance element can be disposed in a small footprint.

Also, it is not necessary to add a special fabrication process for forming the compensation capacitance element, and thereby preventing increase of fabrication costs.

Figure 21:
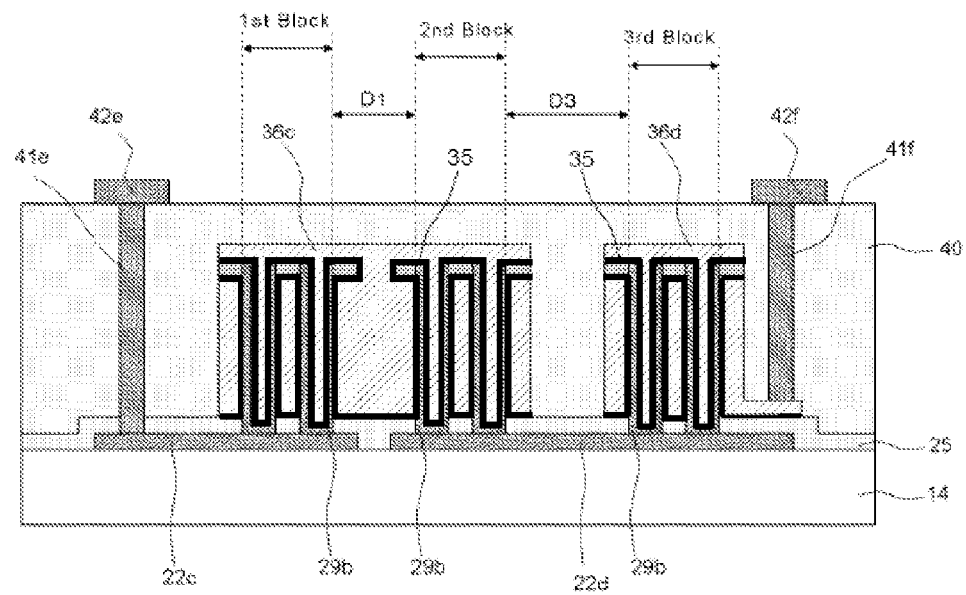
FIG. 21 is a schematic cross-sectional view showing an example of a serial connection of three compensation capacitance blocks.

Next, an example in which three compensation capacitance blocks are connected in series will be described referring to FIG. 21.

The first block and the second block are connected in series through upper electrode 36c as shown in FIG. 19.

The second blocks and a third block are connected in series through common pad 22d.

Upper electrode 36c of the second block and upper electrode 36d of the third block are independently disposed.

Herein, distance D1 between the first and second blocks is set at the same as distance D1 described in FIG. 19 above.

Distance D3 between the second and third blocks is set at a distance (e.g., 2 μm or more) preventing creation of a cavity (void) in fourth interlayer insulating film 40.

That is to say, when three compensation capacitance blocks are connected in series, the invention is applied to only a connection between the first and second compensation capacitance blocks.

In a conventional method, distances D2 and D3 both need to be set at a distance preventing creation of a cavity (void) in fourth interlayer insulating film 40.

The invention is applied to a connection between the first and second compensation capacitance blocks, such that three compensation capacitance blocks can be disposed in a small footprint.

Similarly, even when four or more compensation capacitance blocks are connected in series, the invention can also be applied to a portion in which upper electrodes of adjacent blocks are connected to each other. Therefore, four or more compensation capacitance blocks connected in series to each other can be disposed in a small footprint.

Second Embodiment

Figure 22:
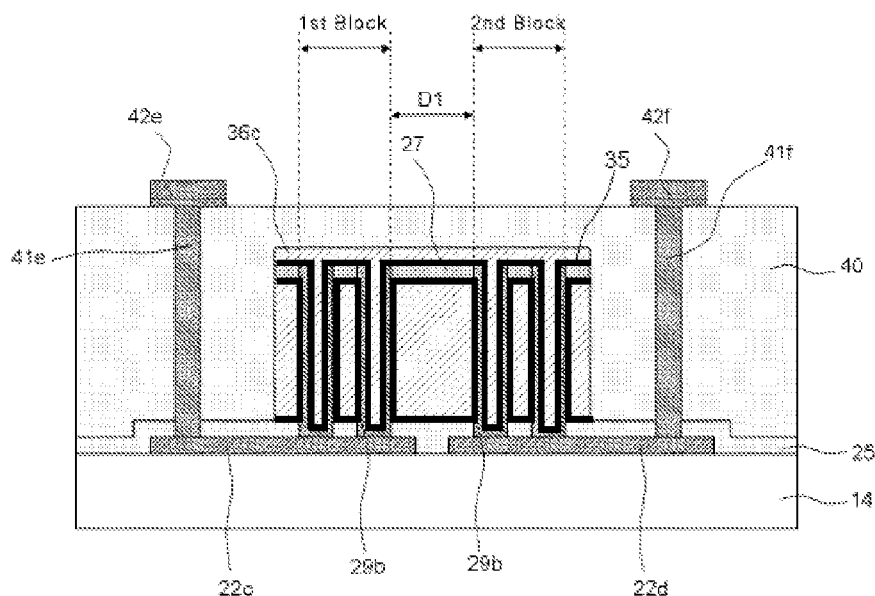
FIG. 22 is a schematic cross-sectional view illustrating a configuration of a compensation capacitance element according to another embodiment of the invention.

When two compensation capacitance blocks are connected in series according to, support film 27 for supporting the lower electrodes 29b can be connected between two blocks as shown in FIG. 22.

Figure 23:
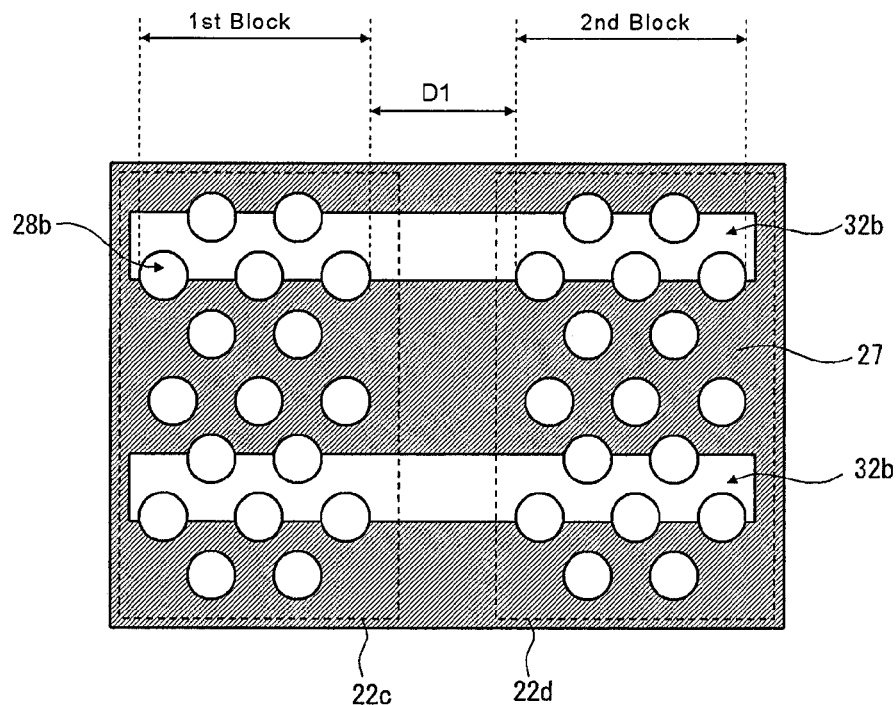
FIG. 23 is a schematic plan view showing an example of a layout of apertures 32b of a support film and holes 28b for lower electrodes in FIG. 22.

In FIG. 23, support film 27 and a layout of holes 28b for the lower electrodes is shown in a schematic plan view. Support film 27 is formed as one large support film connecting between the first block and the second block.

Apertures 32b provided in support film 27 are arranged in a continuous pattern without interruption between the blocks.

Thus, the support film for supporting the lower electrodes is disposed as one large structure between two blocks, such that the support strength thereof can be further enhanced.

Figure 24:
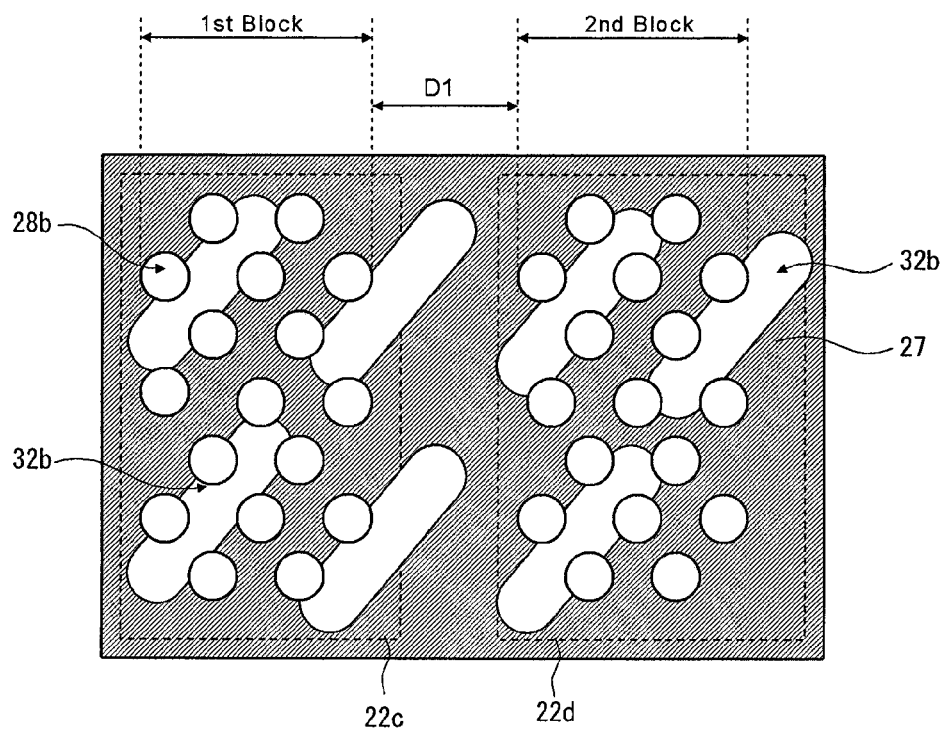
FIG. 24 is a schematic plan view showing an alternative example of a layout of apertures 32b of a support film and holes 28b for lower electrodes in FIG. 22.

A variation of an arrangement of support film 27 integrally disposed between the blocks and a layout of holes 28b for the lower electrodes is shown in a schematic plan view in FIG. 24.

In FIG. 24, apertures 32b provided in support film 27 have not a line shape but an elongated track shape having a longitudinal direction. A plural of apertures 32b is arranged according to a predetermined rule. Due to apertures 32b having such a shape, an area of the support film except for apertures 32b can be increased, and thus the support strength for the lower electrodes can be increased In this time, distance D1 between the first block and the second block is properly set according to a arranging pitch of the lower electrodes, such that apertures 32b can be disposed in a region between the first block and the second block with maintaining the arranging rule of apertures 32b over the first block and the second block. Namely, apertures 32 are formed in all of regions disposed over the first block, over the second block, and between the first block and the second block, with maintaining the predetermined arranging rule.

Thus, apertures 32 are formed without interruption of continuity, such that apertures 32 can be processed in a better precision even when downscaling.

Figure 25:
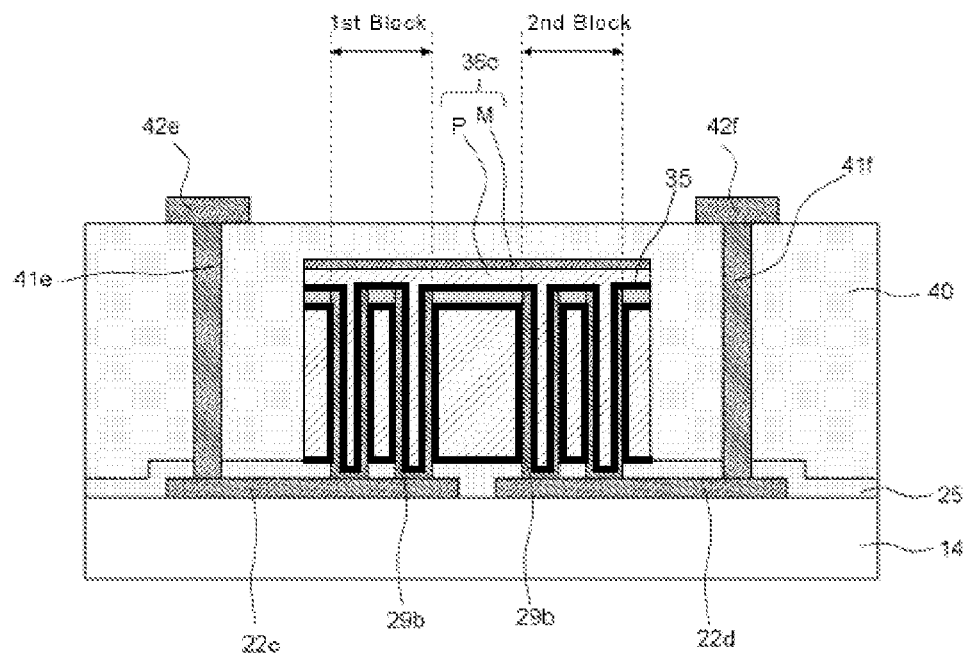
FIG. 25 is a schematic cross-sectional view illustrating a configuration of a compensation capacitance element according to further another embodiment of the invention.

FIG. 25 shows an example in which first upper electrode P including polycrystalline silicon in an upper layer is filled in a gap between blocks, and then a metal film, such as tungsten, is deposited as second upper electrode M. In this case, first upper electrode P and second upper electrode M are integrated to serve as upper electrode 36c of the compensation capacitance element.

In this case, second upper electrode M is not contributed to filling the gap between the blocks. Therefore, based on a film thickness of first upper electrode P, the distance between the blocks is set two or times than film thickness of first upper electrode P Meanwhile, in this case also, support film 27 for supporting lower electrodes 29b can be connected between two blocks as shown in FIG. 25.

The embodiment described above is only an example, and accordingly, various modifications thereof can be made without departing form the sprit of the invention.

A location to which the compensation capacitance elements are connected is not limited the internal power supply wiring to the decoder circuit in FIG. 1, and independent compensation capacitance elements can be respectively connected to a wiring for supplying a internal power supply to other circuits.

Figure 28:
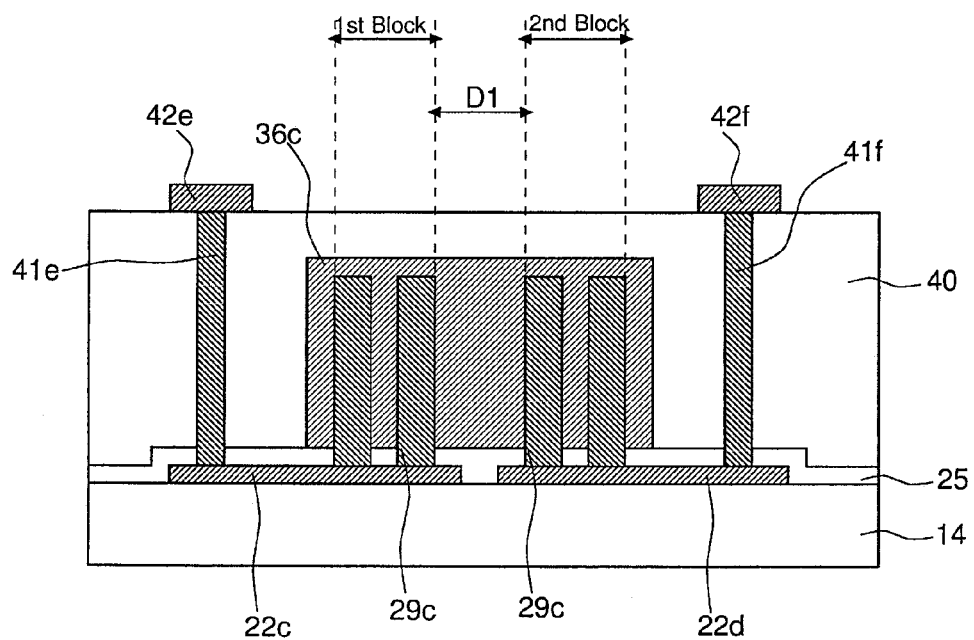
FIG. 28 is a schematic cross-sectional view illustrating a configuration of a compensation capacitance element according to still another embodiment of the invention.
Figure 29:
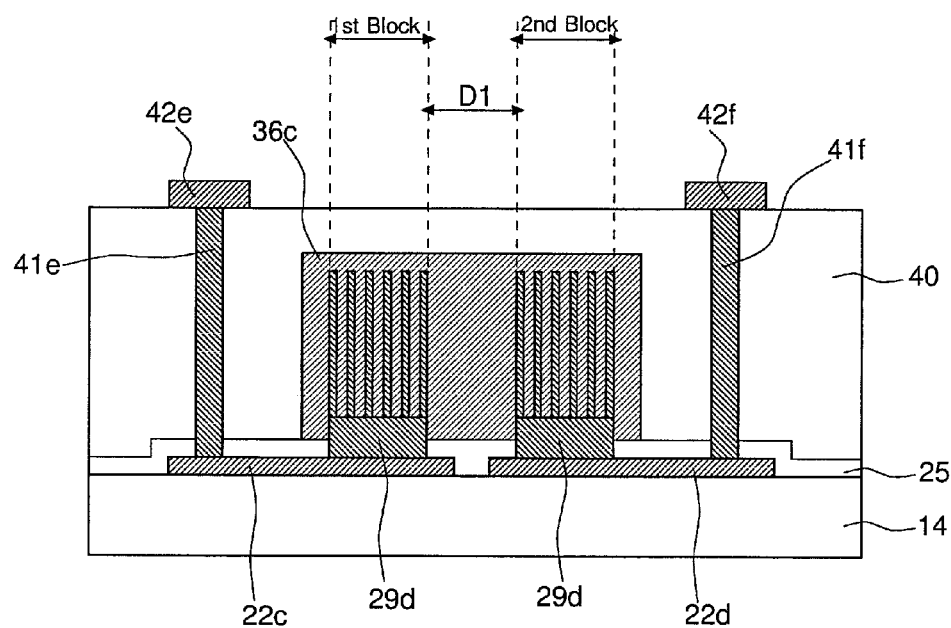
FIG. 29 is a schematic cross-sectional view illustrating a configuration of a compensation capacitance element according to still further another embodiment of the invention.

Also, in addition to the crown-shaped compensation capacitance elements according to the above embodiments, the present invention is applicable to compensation capacitance elements, which include a plurality of lower electrodes having other three-dimensional structure such as a pedestal type and an upper electrode formed on at least outside walls of the plurality of the lower electrodes. For example, FIG. 28 is a schematic cross-sectional view illustrating a configuration of a compensation capacitance element according to still another embodiment of the invention including pedestal type lower electrode 29c. Such a pedestal type lower electrode can be formed in the process of FIG. 7 by filling lower electrode film 29 in holes 28a and 28b and therefore, cap insulating film 30 is no longer necessary. In this configuration, support film 27 is not provided because the pedestal type lower electrode is hard to collapse than the crown-shaped lower electrode. Of course, a support film can be provided in this configuration if the collapse of the lower electrodes is problematic in the process. Alternately, the plurality of the lower electrodes is interchangeable to one lower electrode 29d having a three-dimensional structure as shown in FIG. 29. Further, in the present invention, planar-shaped compensation capacitance elements can be additionally provided.

Furthermore, the invention may not only be applied to a monolithic DRAM, but also to a complex device in which memory cells of DRAM and a logic circuit element are formed on one semiconductor chip.

Application Example

An application example of the semiconductor device according to the invention will now be described.

Figure 26:
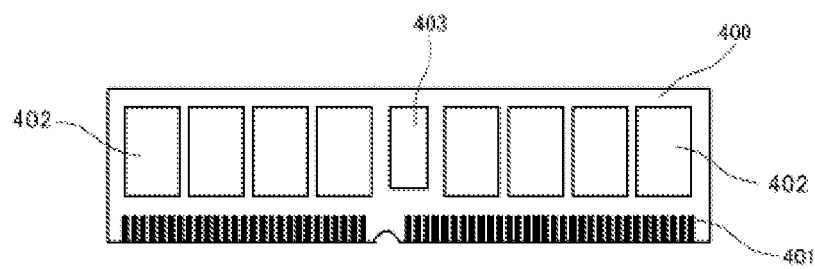
FIG. 26 is a diagram showing an example of a memory module including a semiconductor device according to the invention.

FIG. 26 shows a diagram of a memory module including semiconductor devices (semiconductor chips) functioning as DRAM and fabricated according to the method described the first embodiment.

Numeral reference 402 is a DRAM package which contains a semiconductor chip functioning as DRAM and is mounted on printed-circuit board 400. The package is, for example, a BGA structure type, and is formed using as a single semiconductor chip by known means.

Printed-circuit board 400 is provided with input/output terminals (I/O terminal) 401 for electrically connecting the memory module to an external device. Input and output of data for each DRAM package 402 are performed through I/O terminals 401.

The memory module includes control chip 403 for controlling input/output of data for each DRAM package. Control chip 403 regulates or reshapes timings of clock signals or signal waveforms inputted from an external of the memory module to be supplied to each DRAM package. Alternatively, control chip 403 can be omitted on printed-circuit board 402, but a plurality of DRAM packages can be only mounted on printed-circuit board 402.

By employing the invention, a DRAM chip size can be reduced without decrease of fabrication yield, such that DRAM having a large memory capacity can be fabricated in low cost. Therefore, a memory module corresponding to a large data memory capacity can be fabricated in low cost.

A data processing system as described below can constructed by using the memory module described above having DRAM chips fabricated according to the invention.

Figure 27:
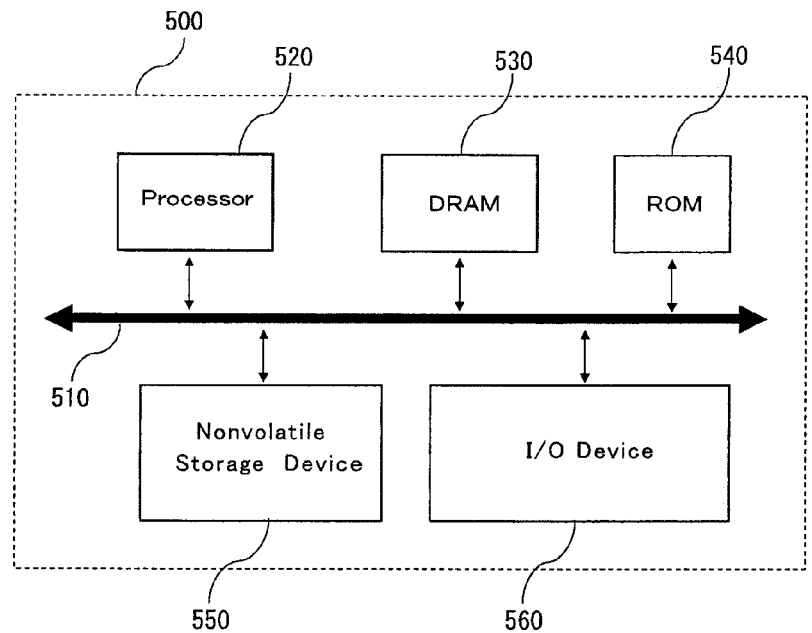
FIG. 27 is a skeleton framework of a data processing system according to one embodiment of the invention.

In FIG. 27, a schematic construction view of data processing system 500 is shown.

Data processing system 500 includes processor 520 and DRAM memory module 530, which are connected to each other through system bus 510.

Processor 520 includes, for example, MPU (Micro Processing Unit), or DSP (Digital Signal Processor). DRAM memory module 530 includes DRAM chips fabricated according to the invention.

In addition, ROM (Read Only Memory) 540 for storing fixed data can be connected to system bus 510.

For purpose of simplicity, one system bus 510 is only shown, but a plurality of system buses can be connected in parallel or in series, as required, through a connector and the like. Also, each of devices can be connected to each other by local buses without intervening of system bus 510.

In data processing system 500, nonvolatile storage device 550 and I/O device 560 are connected to system bus 510, as required. Nonvolatile storage device 550 includes, for example, a hard disk drive, an optical disk drive, or SSD (Solid State Drive).

I/O device 560 includes, for example a display device, such as a liquid crystal display, or a data input device, such as a keyboard.

The number of each of components of data processing system 500 is one in FIG. 27 for purpose of simplicity, but is not limited thereto, and all or any one of components can be plurally provided.

Examples of processing system 500 include, for example, a computer system, but are not limited thereto.

By employing the invention, a high performance data processing system can be constructed by using a memory module having a large memory capacity.

What is claimed is:
1. A semiconductor device, comprising:
a semiconductor substrate including a memory cell region and a peripheral circuit region;
a plurality of memory cells each including a cell transistor and a cell capacitor and formed over the memory cell region of the semiconductor substrate;
first and second capacitor blocks formed over the peripheral circuit region of the semiconductor substrate apart from each other, the first capacitor block comprising:
a first common electrode,
a plurality of first lower electrodes each including a first bottom portion and a first crown-shape portion projecting from a periphery of the first bottom portion, the first bottom portion including a first front surface and a first back surface, the first crown-shape portion including a first inner surface and a first outer surface, each of the first lower electrodes being in electrical contact at the first back surface of the first bottom portion with the first common electrode,
a first dielectric film formed on the first front surface of the first bottom portion and each of the first inner and first outer surfaces of the first crown-shape portion of each of the first lower electrodes, and
a first upper electrode formed on the first dielectric film to cover the first front surface of the first bottom portion and the first inner and first outer surfaces of the first crown-shape portion of each of the first lower electrodes with an intervention of the first dielectric film;
the second capacitor block comprising:
a second common electrode,
a plurality of second lower electrodes each including a second bottom portion and a second crown-shape portion projecting from a periphery of the second bottom portion, the second bottom portion including a second front surface and a second back surface, the second crown-shape portion including a second inner surface and a second outer surface, each of the second lower electrodes being in electrical contact at the second back surface of the second bottom portion with the second common electrode,
a second dielectric film formed on the second front surface of the second bottom portion and the second inner and second outer surfaces of the second crown-shape portion of each of the second lower electrodes, and
a second upper electrode formed on the second dielectric film to cover the second front surface of the second bottom portion and the second inner and second outer surfaces of the second crown-shape portion of each of the second lower electrodes with an intervention of the second dielectric film;
a first support film disposed between one of the first outer surfaces of one of the first lower electrodes and one of the first outer surfaces of another adjacent first lower electrode in order to prevent the first lower electrodes from collapsing; and
a second support film disposed between one of the second outer surfaces of one of the second lower electrodes and one of the second outer surfaces of another adjacent second lower electrode in order to prevent the second lower electrodes from collapsing,
wherein the first upper electrode of the first capacitor block and the second upper electrode are continuously elongated in parallel to the substrate to merge in one body as a first common upper electrode.

2. The device as claimed in claim 1,
wherein the first common electrode is elongated over the semiconductor substrate to provide a first elongated portion and the second common electrode is elongated over the substrate to provide a second elongated portion, and
wherein the device further comprises an interlayer insulating film covering the first and second upper electrodes and the first and second elongated portions, and first and second vias selectively formed in the interlayer insulating film to be connected to the first and second elongated portions, respectively.

3. The device as claimed in claim 1, wherein the first dielectric film of the first capacitor block and the second dielectric film of the second capacitor block are continuously elongated to merge in one body.

4. The device as claimed in claim 1, wherein the cell capacitor comprises:
a third lower electrode including a third bottom portion and a third crown-shape portion projecting from a periphery of the third bottom portion, the third bottom portion including a third front surface and a third back surface, the third crown-shape portion including a third inner surface and a third outer surface, the third lower electrode being in electrical contact at the third back surface of the third bottom portion with the cell transistor,
a third dielectric film formed on the third front surface of the third bottom portion and each of the third inner and third outer surfaces of the third crown-shape portion of the third lower electrode, and
a third upper electrode formed on the third dielectric film to cover the third front surface of the third bottom portion and the third inner and third outer surfaces of the third crown-shape portion of the third lower electrode with an intervention of the third dielectric film.

5. A semiconductor device, comprising:
first and second capacitor blocks formed over a substrate apart from each other,
the first capacitor block comprising:
a first common electrode,
a plurality of first lower electrodes each including a first bottom portion and a first crown-shape portion projecting from a periphery of the first bottom portion, the first bottom portion including a first front surface and a first back surface, the first crown-shape portion including a first inner surface and a first outer surface, each of the first lower electrodes being in electrical contact at the first back surface of the first bottom portion with the first common electrode,
a first dielectric film formed on the first front surface of the first bottom portion and each of the first inner and first outer surfaces of the first crown-shape portion of each of the first lower electrodes, and
a first upper electrode formed on the first dielectric film to cover the first front surface of the first bottom portion and the first inner and first outer surfaces of the first crown-shape portion of each of the first lower electrodes with an intervention of the first dielectric film;
the second capacitor block comprising:
a second common electrode,
a plurality of second lower electrodes each including a second bottom portion and a second crown-shape portion projecting from a periphery of the second bottom portion, the second bottom portion including a second front surface and a second back surface, the second crown-shape portion including a second inner surface and a second outer surface, each of the second lower electrodes being in electrical contact at the second back surface of the second bottom portion with the second common electrode,
a second dielectric film formed on the second front surface of the second bottom portion and the second inner and second outer surfaces of the second crown-shape portion of each of the second lower electrodes, and a second upper electrode formed on the second dielectric film to cover the second front surface of the second bottom portion and the second inner and second outer surfaces of the second crown-shape portion of each of the second lower electrodes with an intervention of the second dielectric film, the first upper electrode of the first capacitor block and the second upper electrode being continuously elongated in parallel to the substrate to merge in one body as a first common upper electrode;

a first support film disposed between one of the first outer surfaces of one of the first lower electrodes and one of the first outer surfaces of another adjacent first lower electrode in order to prevent the first lower electrodes from collapsing;

a second support film disposed between one of the second outer surfaces of one of the second lower electrodes and one of the second outer surfaces of another adjacent second lower electrode in order to prevent the second lower electrodes from collapsing; and a plurality of memory cells each including a cell transistor and the cell capacitor, the cell capacitor comprising:

a third lower electrode including a third bottom portion and a third crown-shape portion projecting from a periphery of the third bottom portion, the third bottom portion including a third front surface and a third back surface, the third crown-shape portion including a third inner surface and a third outer surface, the third lower electrode being in electrical contact at the third back surface of the third bottom portion with the cell transistor, a third dielectric film formed on the third front surface of the third bottom portion and each of the third inner and third outer surfaces of the third crown-shape portion of the third lower electrode, and a third upper electrode formed on the third dielectric film to cover the third front surface of the third bottom portion and the third inner and third outer surfaces of the third crown-shape portion of the third lower electrode with an intervention of the third dielectric film, wherein the first dielectric film of the first capacitor block and the second dielectric film of the second capacitor block are continuously elongated to merge with each other as a first common dielectric film, the third dielectric film of one of the cell capacitors merging with the third dielectric film of each of remaining ones of the cell capacitors as a second common dielectric film, the third upper electrode of the one of the cell capacitors merging with the third upper electrode of each of the remaining ones of the cell capacitors as a second common upper electrode, the first and second common dielectric films being separated from each other, and the first and second common upper electrodes being separated from each other.

6. A semiconductor device comprising:
a semiconductor substrate including a memory cell region and a peripheral circuit region;
a plurality of memory cells each including a cell transistor and a cell capacitor and formed over the memory cell region of the semiconductor substrate;
first and second conductors formed over the peripheral circuit region of the semiconductor substrate apart from each other;

a plurality of first crown-shape conductors each projecting from the first conductor and including a first inner surface and a first outer surface, the first crown-shape conductors being electrically connected with each other through the first conductor;

a plurality of second crown-shape conductors each projecting from the second conductor and including a second inner surface and a second outer surface, the second crown-shape conductors being electrically connected with each other through the second conductor;

a first dielectric film formed on the first inner surface and the first outer surface of each of the first crown-shape conductors;

a second dielectric film formed on the second inner surface and the second outer surface of each of the second crown-shape conductors;

a common conductor including first, second and third portions that merge in one body, the third portion being between the first and second portions, the first portion filling inside and outside of each of the first crown-shape conductors to cover the first inner surface and the first outer surface of each of the first crown-shape conductors with an intervention of the first dielectric film, the second portion filling inside and outside of each of the second crown-shape conductors to cover the second inner surface and the second outer surface of each of the second crown-shape conductors with an intervention of the second dielectric film, the first, second and third portions including a first substantially even upper surface, a second substantially even upper surface and a third substantially even upper surface, respectively, and the first substantially even upper surface, the second substantially even upper surface and the third substantially even upper surface being substantially coplanar with one another;

a first support film disposed between one of the first outer surfaces of one of the first lower electrodes and one of the first outer surfaces of another adjacent first lower electrode in order to prevent the first lower electrodes from collapsing; and a second support film disposed between one of the second outer surfaces of one of the second lower electrodes and one of the second outer surfaces of another adjacent second lower electrode in order to prevent the second lower electrodes from collapsing.

7. The device as claimed in claim 6, wherein each of the first, second and third portions of the common conductor comprises a metal layer and a semiconductor layer formed on the metal layer, each of the metal layers of the first and second portions being between an associated one of the first and second dielectric films and the semiconductor layer.

8. The device as claimed in claim 7, wherein the common conductor further comprises an additional metal layer formed on the semiconductor layer of each of the first, second and third portions.

9. The device as claimed in claim 7, wherein the semiconductor layer of each of the first, second and third portions constitutes an associated one of the first, second and third substantially even upper surfaces.

10. The device as claimed in claim 9, wherein common conductor further comprises an additional metal layer formed on first, second and third substantially even upper surfaces of the first, second and third portions.

11. The device as claimed in claim 6, wherein the first and second dielectric films merge in one body as a common dielectric film.

12. The device as claimed in claim 4, wherein the first dielectric film of the first capacitor block and the second dielectric film of the second capacitor block are continuously elongated to merge with each other as a first common dielectric film, the third dielectric film of one of the cell capacitors merging with the third dielectric film of each of remaining ones of the cell capacitors as a second common dielectric film, the third upper electrode of the one of the cell capacitors merging with the third upper electrode of each of the remaining ones of the call capacitors as a second common upper electrode, the first and second common dielectric films being separated from each other, and the first and second common upper electrodes being separated from each other.

13. The device as claimed in claim 1, further comprising a third capacitor block formed over the peripheral circuit region of the semiconductor substrate apart from each of the first and second capacitor blocks, the third capacitor block comprising:
a plurality of third lower electrodes each including a third bottom portion and a third crown-shape portion projecting from a periphery of the third bottom portion, the third bottom portion including a third front surface and a third back surface, the third crown-shape portion including a third inner surface and a third outer surface, each of the third lower electrodes being in electrical contact at the third back surface of the third bottom portion with the second common electrode,
a third dielectric film formed on the third front surface of the third bottom portion and each of the third inner and third outer surfaces of the third crown-shape portion of each of the third lower electrodes, and
a third upper electrode formed on the third dielectric film to cover the third front surface of the third bottom portion and the third inner and third outer surfaces of the third crown-shape portion of each of the third lower electrodes with an intervention of the third dielectric film, the third upper electrode of the third capacitor block being separated from each of the first and second upper electrodes.

14. The device as claimed in claim 13, further comprising a first terminal electrode provided in an electrical contact with the first common electrode and a second terminal electrode provided in an electrical contact with the third upper electrode so that the first, second and third capacitor blocks are electrically connected in series with one another between the first and second terminal electrodes.

15. The device as claimed in claim 13, wherein the first dielectric film of the first capacitor block and the second dielectric film of the second capacitor block are continuously elongated to merge in one body, and the third dielectric film is separated from each of the first and second dielectric films.

16. The device as claimed in claim 5, wherein the first common electrode is elongated over the substrate to provide a first elongated portion and the second common electrode is elongated over the substrate to provide a second elongated portion, and
wherein the device further comprises an interlayer insulating film covering the first and second upper electrodes and the first and second elongated portions, and first and second vias selectively formed in the interlayer insulating film to be connected to the first and second elongated portions, respectively.

17. The device as claimed in claim 5, wherein further comprising a third capacitor block, comprising:
a plurality of fourth lower electrodes each including a fourth bottom portion and a fourth crown-shape portion projecting from a periphery of the fourth bottom portion, the fourth bottom portion including a fourth front surface and a fourth back surface, the fourth crown-shape portion including a fourth inner surface and a fourth outer surface, each of the fourth lower electrodes being in electrical contact at the fourth back surface of the fourth bottom portion with the second common electrode,
a fourth dielectric film formed on the fourth front surface of the fourth bottom portion and the fourth inner and fourth outer surfaces of the fourth crown-shape portion of each of the fourth lower electrodes, and
a fourth upper electrode formed on the fourth dielectric film to cover the fourth front surface of the fourth bottom portion and the fourth inner and fourth outer surfaces of the fourth crown-shape portion of each of the fourth lower electrodes with an intervention of the fourth dielectric film; and
wherein the fourth upper electrode of the third capacitor block is separated from each of the first upper electrode of the first capacitor block and the second upper electrode of the second capacitor block.

18. The device as claimed in claim 17, wherein the third dielectric film is separated from each of the first and second common dielectric films.

19. The device as claimed in claim 17, wherein the first, second and third capacitor blocks are connected in series with one another between the first common electrode and the fourth upper electrode.

20. A semiconductor device, comprising:
a first capacitor block including first and second terminals and a plurality of first capacitors that are connected in parallel to each other between the first and second terminals; and
a second capacitor block including third and fourth terminals and a plurality of second capacitors that are connected in parallel to each other between the third and fourth terminals, the third terminal being connected to the second terminal so that the first and second capacitor blocks are connected in series with each other between the first and fourth terminals,
wherein the first capacitor block comprises:
a first common conductor serving as the first terminal,
a plurality of first lower electrodes serving as lower electrodes of the first capacitors, respectively, each of the first lower electrodes including a first bottom portion and a first crown-shape portion projecting from a periphery of the first bottom portion, the first bottom portion including a first front surface and a first back surface, the first crown-shape portion including a first inner surface and a first outer surface, each of the first lower electrodes being in electrical contact at the first back surface of the first bottom portion with the first common conductor,
a first dielectric film formed continuously on the first front surface of the first bottom portion and each of the first inner and first outer surfaces of the first crown-shape portion of each of the first lower electrodes,
a first upper electrode formed continuously on the first dielectric film to cover the first front surface of the first bottom portion and the first inner and first outer surfaces of the first crown-shape portion of each of the first lower electrodes with an intervention of the first dielectric film, the first upper electrode being used in common as upper electrodes of the first capacitors and serving as the second terminal, and
a first support film disposed between one of the first outer surfaces of one of the first lower electrodes and one of the first outer surfaces of another adjacent first lower electrode in order to prevent the first lower electrodes from collapsing, wherein the second capacitor block comprises:
- a second common conductor serving as the fourth terminal,
- a plurality of second lower electrodes serving as lower electrodes of the second capacitors, respectively, each of the second lower electrodes including a second bottom portion and a second crown-shape portion projecting from a periphery of the second bottom portion, the second bottom portion including a second front surface and a second back surface, the second crown-shape portion including a second inner surface and a second outer surface, each of the second lower electrodes being in electrical contact at the second back surface of the second bottom portion with the second common conductor,
- a second dielectric film formed continuously on the second front surface of the second bottom portion and each of the second inner and second outer surfaces of the second crown-shape portion of each of the second lower electrodes,
- a second upper electrode formed continuously on the second dielectric film to cover the second front surface of the second bottom portion and the second inner and second outer surfaces of the second crown-shape portion of each of the second lower electrodes with an intervention of the second dielectric film, the second upper electrode being used in common as upper electrodes of the second capacitors and serving as the third terminal, and
- a second support film disposed between one of the second outer surfaces of one of the second lower electrodes and one of the second outer surfaces of another adjacent second lower electrode in order to prevent the second lower electrodes from collapsing, wherein the first upper electrode of the first capacitor block and the second upper electrode of the second capacitor block are elongated to merge in one body to connect the second terminal of the first capacitor block and the third terminal of the second capacitor block with each other.

21. The device as claimed in claim 20, wherein the first dielectric film of the first capacitor block and the second dielectric film of the second capacitor block are elongated to merge in one body.

22. The device as claimed in claim 20, further comprising:
a third capacitor block including a fifth terminal and a plurality of third capacitors that are connected in parallel to each other between the fourth and fifth terminals, the first, second and third capacitor blocks being connected in series with each other between the first and fifth terminals, and the third capacitor block comprising:
- a plurality of third lower electrodes serving as lower electrodes of the third capacitors, respectively, each of the third lower electrodes including a third bottom portion and a third crown-shape portion projecting from a periphery of the third bottom portion, the third bottom portion including a third front surface and a third back surface, the third crown-shape portion including a third inner surface and a third outer surface, each of the third lower electrodes being in electrical contact at the third back surface of the third bottom portion with the second common conductor,
- a third dielectric film formed continuously on the third front surface of the third bottom portion and each of the third inner and third outer surfaces of the third crown-shape portion of each of the third lower electrodes, and
- a third upper electrode formed continuously on the third dielectric film to cover the third front surface of the third bottom portion and the third inner and third outer surfaces of the third crown-shape portion of each of the third lower electrodes with an intervention of the third dielectric film, the third upper electrode being used in common as upper electrodes of the third capacitors and being separated from each of the first and second upper electrodes to serve as the fifth terminal.

23. The device as claimed in claim 22, wherein the first dielectric film of the first capacitor block and the second dielectric film of the second capacitor block are elongated to merge in one body, and the third dielectric film is separated from each of the first and second dielectric films.

24. The device as claimed in claim 20, further comprising a plurality of memory cells each including a cell transistor and a cell capacitor, the memory cells being disposed adjacently to one another to provide a memory cell array region, and each of the first and second capacitor blocks being disposed apart from the memory cell array region.

25. The device as claimed in claim 24, wherein the first dielectric film of the first capacitor block and the second dielectric film of the second capacitor block are elongated to merge in one body to provide a first common dielectric film, and a dielectric film of one of the cell capacitors merges with a dielectric film of each of remaining ones of the cell capacitors to provide a second common dielectric film, the first common dielectric film is separated from the second dielectric film.

26. The device as claimed in claim 25, wherein an upper electrode of the one of the cell capacitors merges with an upper electrode of each of the remaining ones of the cell capacitors to provide a cell plate electrode, the cell plate electrode being separated from each of the first and second upper electrodes.

27. The device as claimed in claim 1, wherein only the first support film and the second support film support the first lower electrodes and the second lower electrodes, respectively, and prevent the first lower electrodes and the second lower electrodes from collapsing, free of a guard ring region.

* * * * *